(12) United States Patent
Inoue et al.

(10) Patent No.: US 7,463,111 B2
(45) Date of Patent: Dec. 9, 2008

(54) SEMICONDUCTOR DEVICE

(75) Inventors: Akira Inoue, Tokyo (JP); Seiki Gotou, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 363 days.

(21) Appl. No.: 11/316,994

(22) Filed: Dec. 27, 2005

(65) Prior Publication Data

US 2006/0152300 A1    Jul. 13, 2006

(30) Foreign Application Priority Data

Jan. 11, 2005    (JP) .............................. 2005-004387

(51) Int. Cl.
*H03H 7/38* (2006.01)
(52) U.S. Cl. ....................................... 333/33
(58) Field of Classification Search .................. 333/33; 330/286, 302, 305, 306, 307
See application file for complete search history.

(56) References Cited

U.S. PATENT DOCUMENTS 5,473,281 A * 12/1995 Honjo ........................ 330/286

6,177,841 B1    1/2001   Ohta et al.

FOREIGN PATENT DOCUMENTS

JP    2004-254223    9/2004

OTHER PUBLICATIONS

Inoue et al. "Analysis of Class-F and Inverse Class-F Amplifiers", IEEE MTT-S Digest, pp. 775-778, 2000.

* cited by examiner

*Primary Examiner*—Stephen E Jones
(74) *Attorney, Agent, or Firm*—Leydig, Voit & Mayer, Ltd.

(57) ABSTRACT

At least one of wiring areas divided by substrate dividing slits includes a region on which none of the strip conductors is located, the region having a U-shape as viewed in plan and enclosing one of the strip conductors on three sides. The length of the enclosed strip conductor is set such that, at a harmonic of a fundamental frequency, the strip line, including the enclosed strip conductor, exhibits very low impedance and acts as a short circuit. The length of the enclosed strip conductor may be set substantially equal to $1/(4n)$ times the wavelength corresponding to a fundamental frequency, to short circuit the nth harmonic, where n is an integer. Both ends of the U-shaped region are preferably disposed on the side of the surface of the matching circuit substrate closest to a transistor.

7 Claims, 18 Drawing Sheets

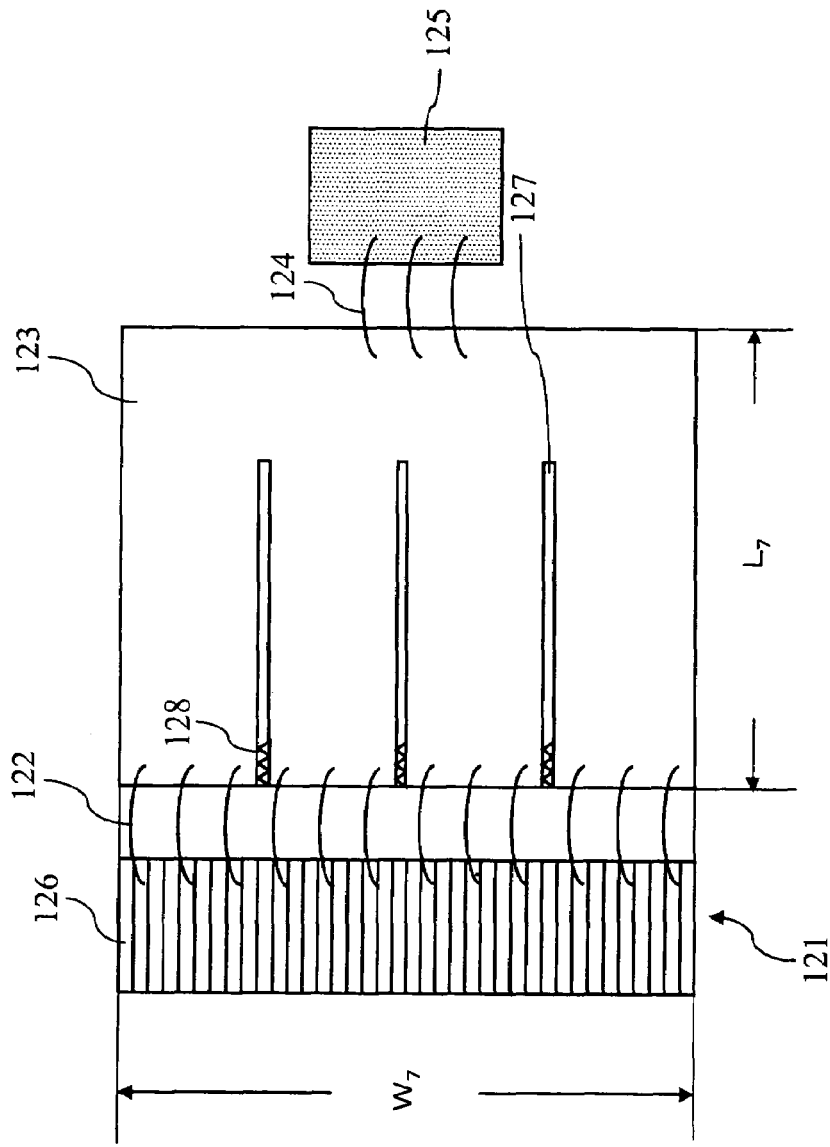
Fig.21 *Prior Art*

SEMICONDUCTOR DEVICE

BACKGROUND OF THE INVENTION

1. Field of the Invention

The present invention relates to a semiconductor device, and more particularly to a semiconductor device primarily used in a high frequency band 800 MHz or higher.

2. Background Art

FIG. 21 is a plan view of a conventional high-frequency high-power internally matched type FET (Field Effect Transistor) designed to operate primarily at a frequency of 0.8 GHz or higher with an output power of 10 W or more.

Referring to the figure, the drain electrodes (not shown) of an FET 121 are connected to a matching circuit substrate 123 by wires 122. Further, the source electrodes (not shown) of the FET 121 are connected to the ground electrode (not shown) on the back surface through via holes (not shown) provided in the FET 121. Though not shown in FIG. 21, the gate electrodes (not shown) of the FET 121, like the drain electrodes, are connected to another matching circuit substrate (not shown). The matching circuit substrate 123, to which the drain electrodes are connected, is connected to an external matching circuit substrate 125 by wires 124. The width $W_7$ of the FET 121 and the matching circuit substrate 123 is approximately 4 mm.

Generally, in an internally matched type FET, the impedance of the FET element must be converted to a high impedance 50 O or so. Therefore, the internally matched type FET must include an impedance converting line having a length corresponding to approximately $\lambda/4$, where $\lambda$ is the operational wavelength of the semiconductor device determined by its operational frequency.

For example, referring to FIG. 21, when the relative permittivity and the thickness of the matching circuit substrate 123 are 90 and 380 μm, respectively, the length $L_7$ of the matching circuit substrate 123 is set to approximately 2 mm at an operational frequency of 5 GHz. It should be noted that an external matching circuit substrate 125 may need to be added, as shown in FIG. 21, if the matching circuit substrate 123 alone cannot provide a desired impedance.

Incidentally, the FET 121 actually includes a number of FET elements 126 disposed in parallel to one another to achieve high output power. The number of FET elements 126 to be employed is determined based on the required output power. Usually, the FET 121 includes approximately 10 to 100 FET elements 126. Therefore, due to this configuration, loops may be formed between these FET elements 126, which might lead to parasitic oscillation. To prevent this from happening, substrate dividing slits 127 may be cut into the matching circuit substrate 123 to separate the strip conductors or wires, not shown, on the matching circuit substrate 123. Further, resistances 128 may be provided between the separated strip conductors as necessary to suppress odd modes.

The FET elements 126 are spaced only 5 μm to 100 μm apart from one another to achieve high power density. Therefore, to provide sufficient impedance conversion using the limited width ($W_7$) of the FET 121, the substrate 123 is formed of a material that allows for formation of low impedance lines, that is, formed of a high dielectric constant material having a relative permittivity of approximately 30 to 300.

The impedance at the fundamental wavelength is designed based on a $\lambda/4$ impedance conversion circuit. Further, to achieve a high efficiency operation, it is necessary to optimize the impedance at the harmonics. Specifically, the Class-F operation requires even harmonics, such as the second harmonic, to be short circuited, while the inverse Class-F operation requires odd harmonics such as the third harmonic to be short circuited. (See, e.g., Akira Inoue et al., "Analysis of Class-F and Inverse Class-F Amplifiers", TECHNICAL REPORT OF IEICE ED2000-231, p. 29-35, by The Institute of Electronics, Information and Communication Engineers.)

However, conventional internally matched type FETs are packaged such that the FET elements and one or more matching circuit substrates are disposed in parallel, restricting the space in the device width direction. This makes it difficult to add a new circuit (a stub, etc.) for matching at harmonics. As a result, these FETs cannot have optimized matching characteristics at harmonics, failing to achieve increased efficiency.

Further, they cannot sufficiently reflect harmonics internally within the matching circuit substrate, requiring a filter for preventing the leakage of the harmonics from the devices. This results in increased device cost and size.

SUMMARY OF THE INVENTION

The present invention has been devised in view of the above problems. It is, therefore, an object of the present invention to provide a semiconductor device in which the matching circuit substrate establishes impedance matching at harmonics to achieve high efficiency.

Another object of the present invention is to provide a semiconductor device in which harmonics are almost totally internally reflected to prevent their leakage from the device.

According to one aspect of the present invention, a semiconductor device comprises a transistor, a matching circuit substrate electrically connected to the transistor, strip conductors or wires formed on a surface of the matching circuit substrate, and a wiring dividing region formed in the matching circuit substrate so as to divide the surface of the matching circuit substrate into wiring areas having the strip conductors thereon. At least one of the wiring areas includes a region on which none of the strip conductors are formed. The region has a U-shape as viewed in plan and enclosing one of the strip conductors on three sides. A length of the enclosed strip conductor is set such that at a harmonic the strip line including the enclosed strip conductor exhibits very low impedance and hence acts as a short circuit.

According to another aspect of the present invention, a semiconductor device comprises a transistor, a matching circuit substrate electrically connected to the transistor, strip conductors or wires formed on a surface of the matching circuit substrate and a wiring dividing region formed in the matching circuit substrate so as to divide the surface of the matching circuit substrate into wiring areas having the strip conductors thereon. At least one of the wiring areas includes a region on which none of the strip conductors are formed. The region has an L-shape as viewed in plan. A length of the one of the strip conductors enclosed on three sides by the L-shaped region and an edge of the matching circuit substrate or by the L-shaped region and the wiring dividing region is set such that at a harmonic the strip line, including the enclosed strip conductor, exhibits very low impedance and hence acts as a short circuit.

According to other aspect of the present invention, a semiconductor device comprises a transistor, a matching circuit substrate electrically connected to the transistor, first strip conductors or wires formed on a surface of the matching circuit substrate, and a wiring dividing region formed in the matching circuit substrate so as to divide the surface of the matching circuit substrate into wiring areas having the first strip conductors thereon. The matching circuit substrate includes a first dielectric layer and a second dielectric layer formed on the first dielectric layer. The first dielectric layer has a ground electrode on a back surface thereof. The second dielectric layer has the first strip conductors on a surface thereof. Via holes are provided in the second dielectric layer. Each first strip conductor is electrically connected to a respective one of second strip conductors formed on a surface of the first dielectric layer through a respective via hole. A wire length from the first strip conductors to the ground electrode is set such that at a harmonic the matching circuit exhibits very low impedance and acts as a short circuit.

According to further aspect of the present invention, a semiconductor device comprises a transistor, a matching circuit substrate electrically connected to the transistor, first strip conductors or wires formed on a surface of the matching circuit substrate, and a wiring dividing region formed in the matching circuit substrate so as to divide the surface of the matching circuit substrate into wiring areas having the first strip conductors thereon. The matching circuit substrate includes a dielectric layer having second strip conductors and a ground electrode on a back surface thereof. Each second strip conductor is electrically connected to a respective first strip conductor through a respective one of via holes provided in the dielectric layer. A wire length from the first strip conductors to the ground electrode is set such that at a harmonic the matching circuit exhibits very low impedance and acts as a short circuit.

Other objects and advantages of the present invention will become apparent from the following description.

BRIEF DESCRIPTION OF THE DRAWINGS

FIG. 21 is a plan view of a conventional semiconductor device.

DETAILED DESCRIPTION OF THE PREFERRED EMBODIMENTS

First Embodiment

Figure 1:
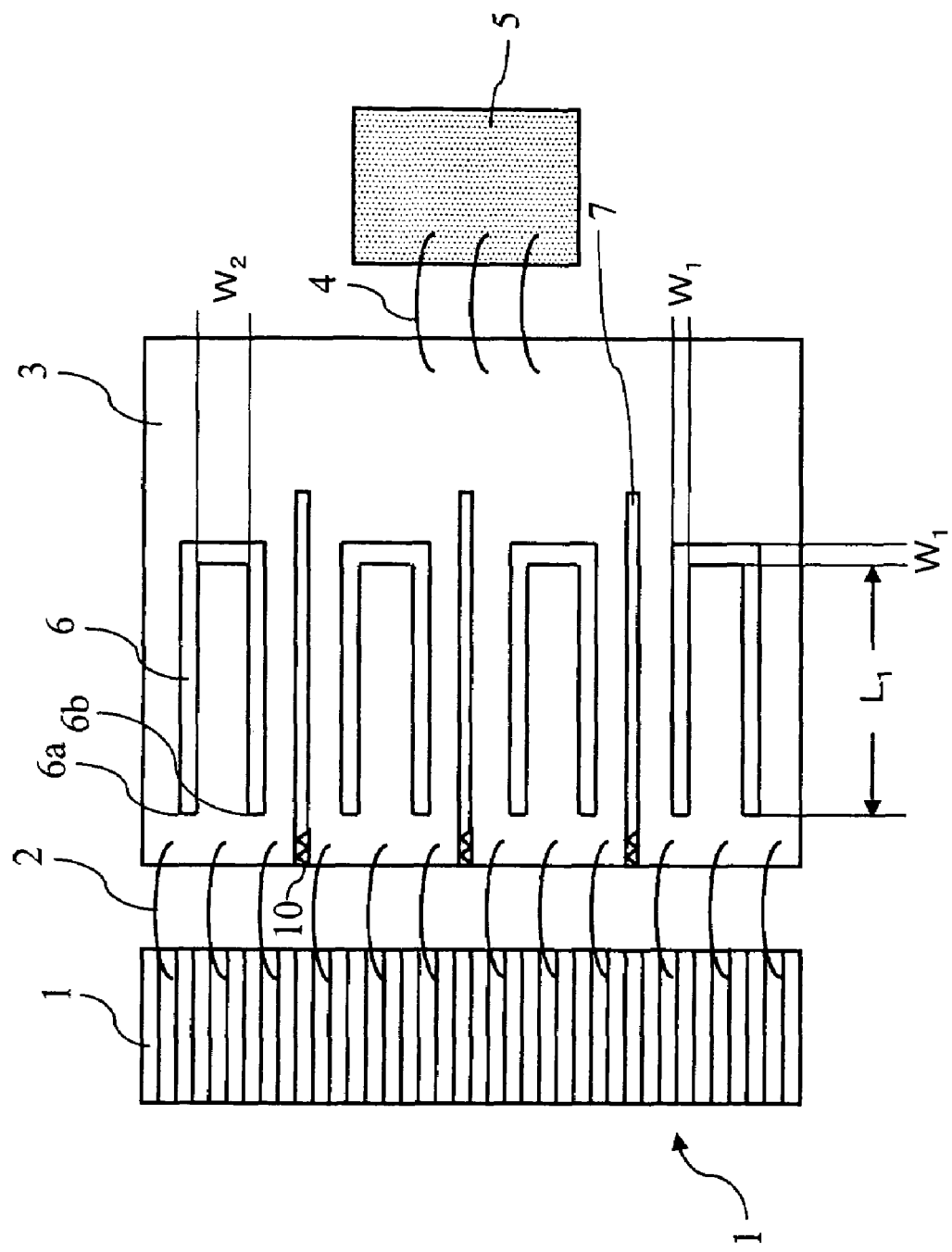
FIG. 1 is a plan view of a semiconductor device according to a first embodiment.

FIG. 1 is a plan view of a semiconductor device according to a first embodiment of the present invention.

Referring to the figure, an FET (Field Effect Transistor) 1 includes a number of FET elements 1' disposed in parallel to one another. The drain electrodes (not shown) of the FET 1 are connected to a matching circuit substrate 3 by wires 2. Further, the source electrodes (not shown) of the FET 1 are connected to the ground electrode (not shown) on the back surface through via holes (not shown) provided in the FET 1. Though not shown in FIG. 1, the gate electrodes (not shown) of the FET 1, like the drain electrodes, are connected to another matching circuit substrate (not shown). The matching circuit substrate 3, to which the drain electrodes are connected, is connected to an external matching circuit substrate 5 by wires 4. It should be noted that reference numeral 7 denotes substrate dividing slits or wiring dividing regions. Resistances 10 may be provided on the drain electrode sides of the substrate dividing slits 7 as necessary to suppress odd modes.

The present embodiment is characterized in that: regions 6 with no strip conductor thereon are formed on the matching circuit substrate 3 such that each region 6 has a U-shape as viewed in plan; and the length of the strip conductor enclosed on three sides by each region 6 is set such that at a harmonic the strip line exhibits very low impedance and hence acts as a short circuit. Specifically, the length of the strip conductor may be set substantially equal to $1/(4n)$ times the fundamental wavelength to short circuit the nth harmonic, where n is an integer.

In FIG. 1, the length $L_1$ of the strip conductor enclosed on three sides by each region 6 is set substantially equal to one-eighth of the wavelength of the fundamental to cause the strip line to resonate at a frequency double the operational frequency f (or the wavelength λ) of the semiconductor device or the FET 1.

As shown in the figure, both ends 6a and 6b of each region 6 are disposed on the side of the matching circuit substrate 3 closest to the transistors, that is, they are both on the FET1 drain electrode side of the matching circuit substrate 3. As a result, one end of each strip line is open. Therefore, at the second harmonic, each strip line exhibits very low impedance and hence acts substantially as a short circuit, since the strip conductor has a length substantially equal to a quarter wavelength of the second harmonic. This means that the matching circuit substrate 3 appears to the FET 1 almost as a short circuit at the second harmonic.

Generally, a matching circuit substrate has a high relative permittivity, between 30 and 300, to provide low impedance per unit substrate area. Therefore, the lines of electric force originating from the wires 4 connected to the matching circuit substrate 3 extend substantially perpendicularly to the ground electrode on the back surface. Accordingly, each strip line can be made to function as a resonant component even if the width $W_1$ of the regions 6 is set small, allowing the strip conductors and the regions 6 to be fully accommodated within the area of the matching circuit substrate 3.

For example, when the operational frequency is 5 GHz, the matching circuit substrate may be formed to have a thickness of 380 μm, a relative permittivity of 90, a width of approximately 4 mm, and a length of approximately 2 mm. In this case, the strip lines can resonate at the second harmonic when the width $W_1$ and the length $L_1$ of the regions 6 are 50 μm and 1 mm, respectively.

The wider the width $W_2$ of the portion enclosed on three sides by each region 6, the lower the impedance of its resonant line or strip line, and hence the more fully short circuited the second harmonic. These relations will be described with reference to FIGS. 2 and 3.

Figure 2:
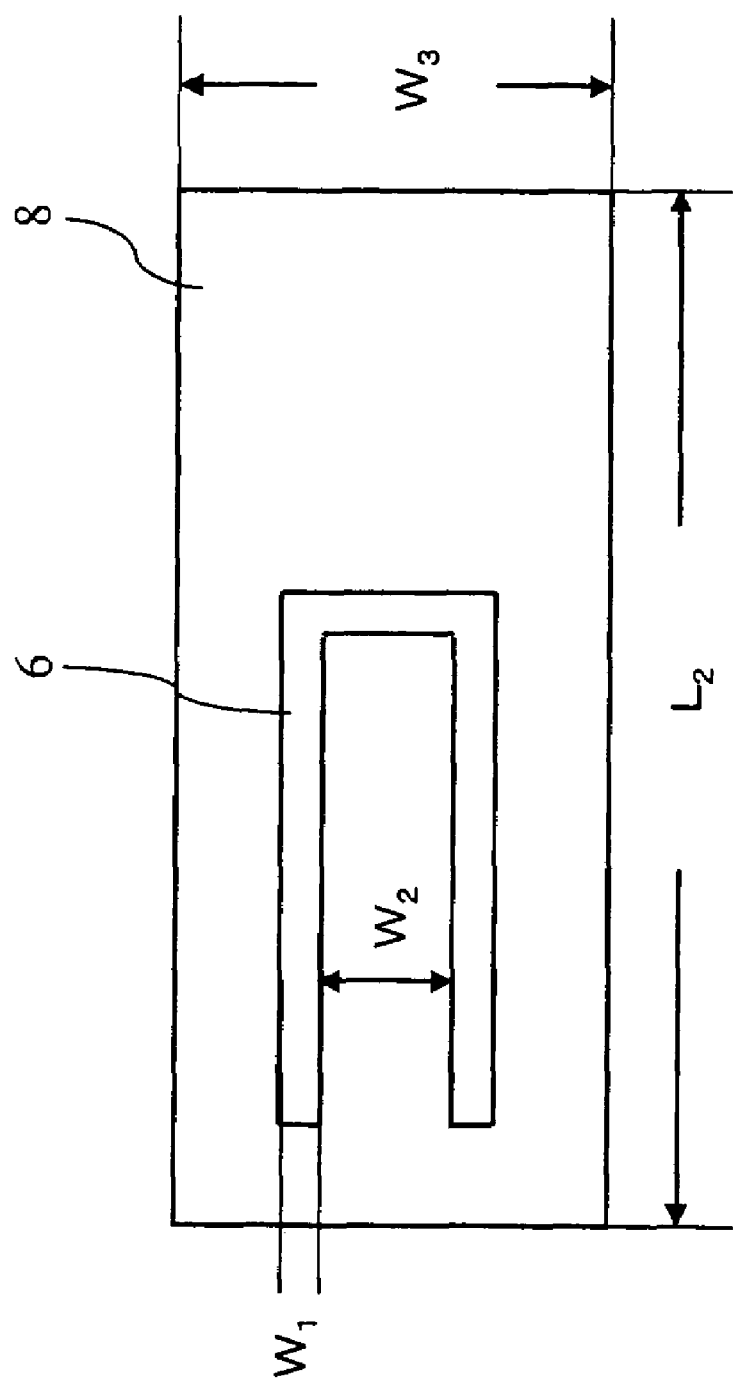
FIG. 2 shows one of portions of a matching circuit substrate in FIG. 1.
Figure 3:
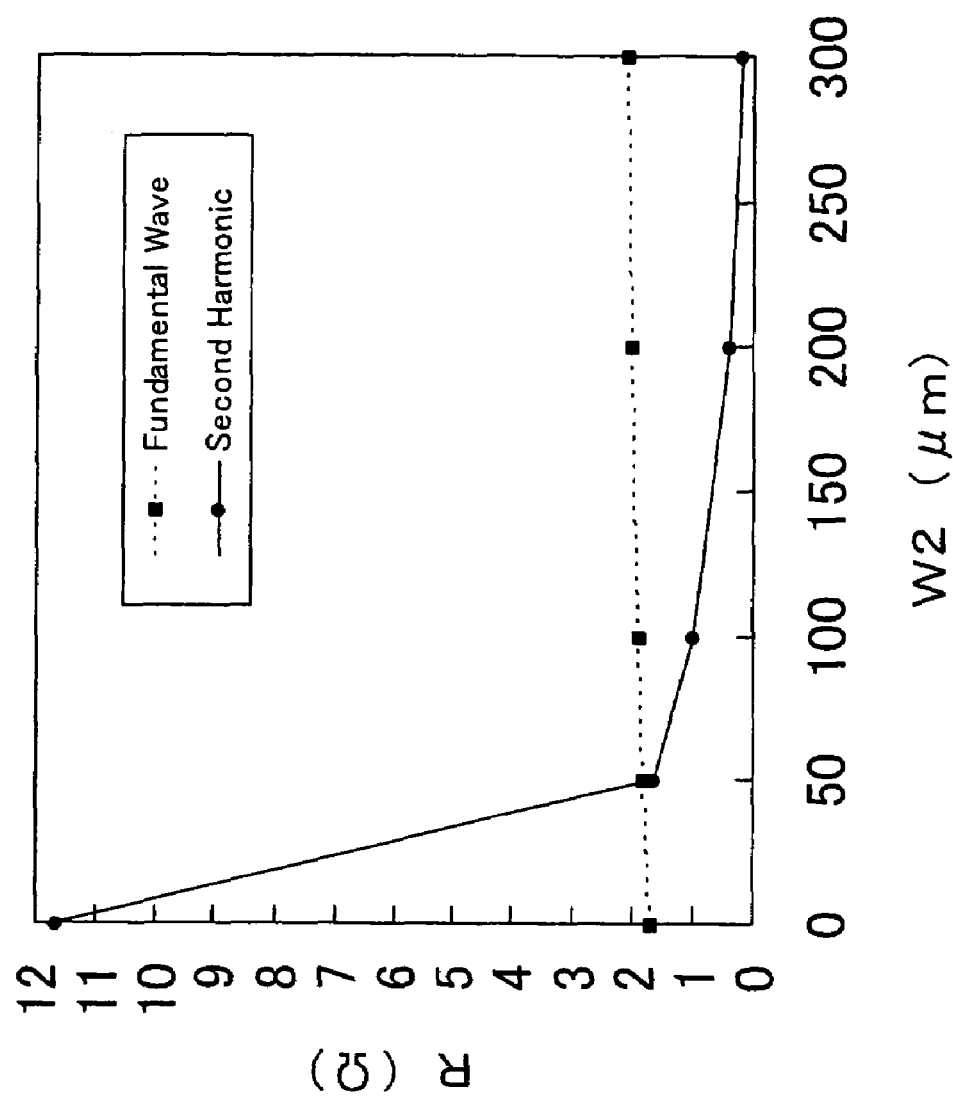
FIG. 3 shows a relationship between width $W_2$ and impedance in FIG. 1.

FIG. 2 shows one of the portions of the matching circuit substrate 3 separated by the substrate dividing slits 7 shown in FIG. 1. (This portion is hereinafter referred to as the "matching circuit substrate portion 8".) The matching circuit substrate portion 8 occupies approximately one quarter of the area of the entire matching circuit substrate 3. In the example shown in FIG. 2, the width $W_3$ and the length $L_2$ of the matching circuit substrate portion 8 are 0.95 mm and 1.9 mm, respectively, and the width $W_1$ of the region 6 is 0.05 mm. FIG. 3 shows a relationship between the width $W_2$ and the impedance obtained from s-parameter data obtained through electromagnetic field simulation.

As can be seen from FIG. 3, the impedance of the matching circuit substrate portion 8 at the fundamental (5 GHz) is substantially constant regardless of the width $W_2$. At the second harmonic, however, the real part of the impedance drastically decreases with increasing width $W_2$. It should be noted that for the strip line to fully acts as a short circuit at the second harmonic, its impedance must be 4 times or more smaller at the second harmonic than at the fundamental. FIG. 3 indicates that the width $W_2$ should be 200 μm or more. This value is approximately one-fifth of the width $W_3$ of the matching circuit substrate portion 8, meaning that the width $W_2$ must be set to one-fifth or more of the width $W_3$ for the strip line to fully act as a short circuit. Therefore, the width $W_2$ shown in FIG. 2 may be set to, for example, approximately 0.3 mm.

As described above, the present embodiment is characterized in that regions with no strip conductor thereon are formed on the matching circuit substrate such that each region has a U-shape as viewed in plan, thereby eliminating the need for adding a new external circuit to the matching circuit substrate. Therefore, it is not necessary to change the size of the matching circuit substrate and hence the size of the package, preventing an increase in cost.

Further, the present embodiment allows the matching circuit to exhibit very low impedance at the second harmonic and hence act substantially as a short circuit to this harmonic. This arrangement enables the semiconductor device to achieve a near Class-F operation and hence high efficiency.

Still further, the present embodiment allows the second harmonic to be short circuited and thereby internally reflected, reducing its leakage from the device. Therefore, it is possible to eliminate the external filter for reducing the second harmonic conventionally provided for the semiconductor device. Or alternatively, the conventional external filter may be replaced by a lower performance filter. These allow one to reduce the size and cost of the entire semiconductor device package.

It should be noted that in the example shown in FIG. 1, a U-shaped region with no strip conductor thereon is provided in each of the four portions of the matching circuit substrate 3 separated by the substrate dividing slits 7. However, the present invention is not limited to this particular arrangement. Only one of the portions separated by the substrate dividing slits 7 may include a U-shaped region. However, the arrangement shown in FIG. 1 allows the matching circuit to more fully act as a short circuit and further increases the efficiency of the semiconductor device, since each enclosed strip line can act substantially as a short circuit. Furthermore, this arrangement can more noticeably reduce the leakage of the second harmonic from the semiconductor device.

Second Embodiment

Figure 4:
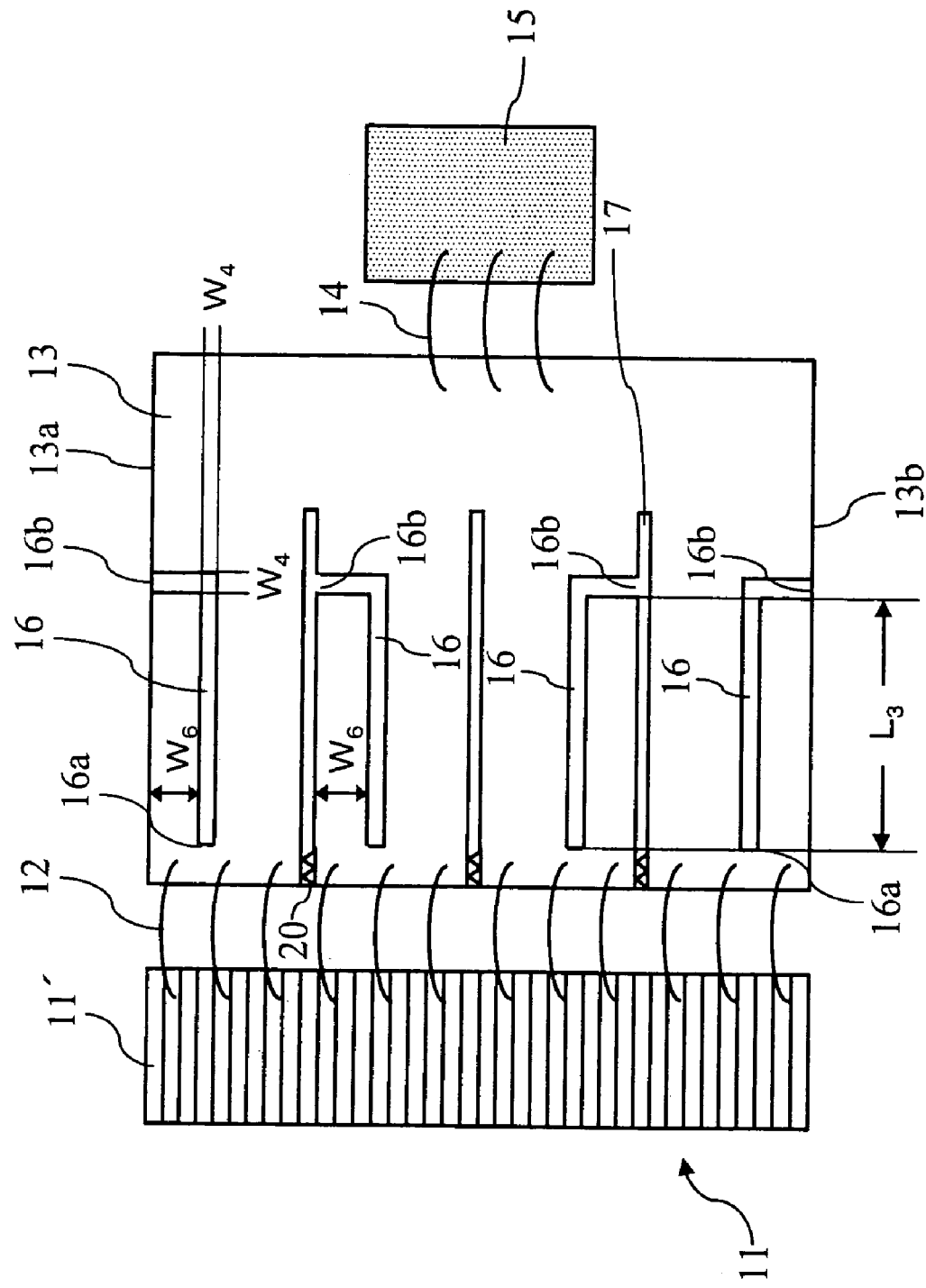
FIG. 4 is a plan view of a semiconductor device according to a second embodiment.

FIG. 4 is a plan view of a semiconductor device according to a second embodiment of the present invention.

Referring to the figure, an FET 11 includes a number of FET elements 11' disposed in parallel to one another. The drain electrodes (not shown) of the FET 11 are connected to a matching circuit substrate 13 by wires 12. Further, the source electrodes (not shown) of the FET 11 are connected to the ground electrode (not shown) on the back surface through via holes (not shown) provided in the FET 11. Though not shown in FIG. 4, the gate electrodes (not shown) of the FET 11, like the drain electrodes, are connected to another matching circuit substrate (not shown). The matching circuit substrate 13, to which the drain electrodes are connected, is connected to an external matching circuit substrate 15 by wires 14. It should be noted that in FIG. 4 reference numeral 17 denotes substrate dividing slits or wiring dividing regions. Resistances 20 may be provided on the drain electrode sides of the substrate dividing slits 17 as necessary to suppress odd modes.

The present embodiment is characterized in that: regions 16 with no strip conductor thereon are formed on the matching circuit substrate 13 such that each region 16 has an L-shape as viewed in plane; and the length of each strip conductor enclosed on three sides by a respective region 16 and an edge 13a or 13b of the matching circuit substrate 13 together or by a respective region 16 and a respective substrate dividing slit 17 together is set such that at a harmonic the strip line exhibits very low impedance and hence acts as a short circuit. Specifically, the length of each strip conductor may be set substantially equal to 1/(4n) times the fundamental wavelength to short circuit the nth harmonic, where n is an integer.

As shown in FIG. 4, one end 16a of each region 16 is disposed on the side of the matching circuit substrate 13 closest to the transistors, that is, it is on the FET 11 drain electrode side of the matching circuit substrate 13. The other end 16b of each region 16 extends to the edge 13a or 13b of the matching circuit substrate 13 or extends to a substrate dividing slit 17.

The length $L_3$ of the strip conductors, each enclosed on three side by a respective region 16 and the edge 13a or 13b of the matching circuit substrate 13 together or by a respective region 16 and a respective substrate dividing slit 17 together, is set substantially equal to one-eighth of the wavelength of the fundamental to cause the strip lines to resonate at a frequency double the operational frequency f of the semiconductor device. Therefore, at the second harmonic, each strip line exhibits very low impedance and hence acts substantially as a short circuit, since the strip conductor has a length substantially equal to a quarter wavelength of the second harmonic. This means that the matching circuit substrate 13 appears to the FET 11 almost as a short circuit at the second harmonic.

For example, when the operational frequency is 5 GHz, the matching circuit substrate may be formed to have a thickness of 380 μm, a relative permittivity of 90, a width of approximately 4 mm, and a length of approximately 2 mm. In this case, the matching circuit can resonate at the second harmonic when the width $W_4$ and the $L_3$ of the regions 16 are 50 μm and 1 mm, respectively.

The wider the width $W_6$ of the strip conductors each enclosed on three sides by a respective region 16 and the edge 13a or 13b of the matching circuit substrate 13 together or by a respective region 16 and a respective dividing slit 17 together, the lower the impedance of the resonant lines or strip lines and hence more fully short circuited the second harmonic. These relations will be described with reference to FIGS. 5 and 6.

Figure 5:
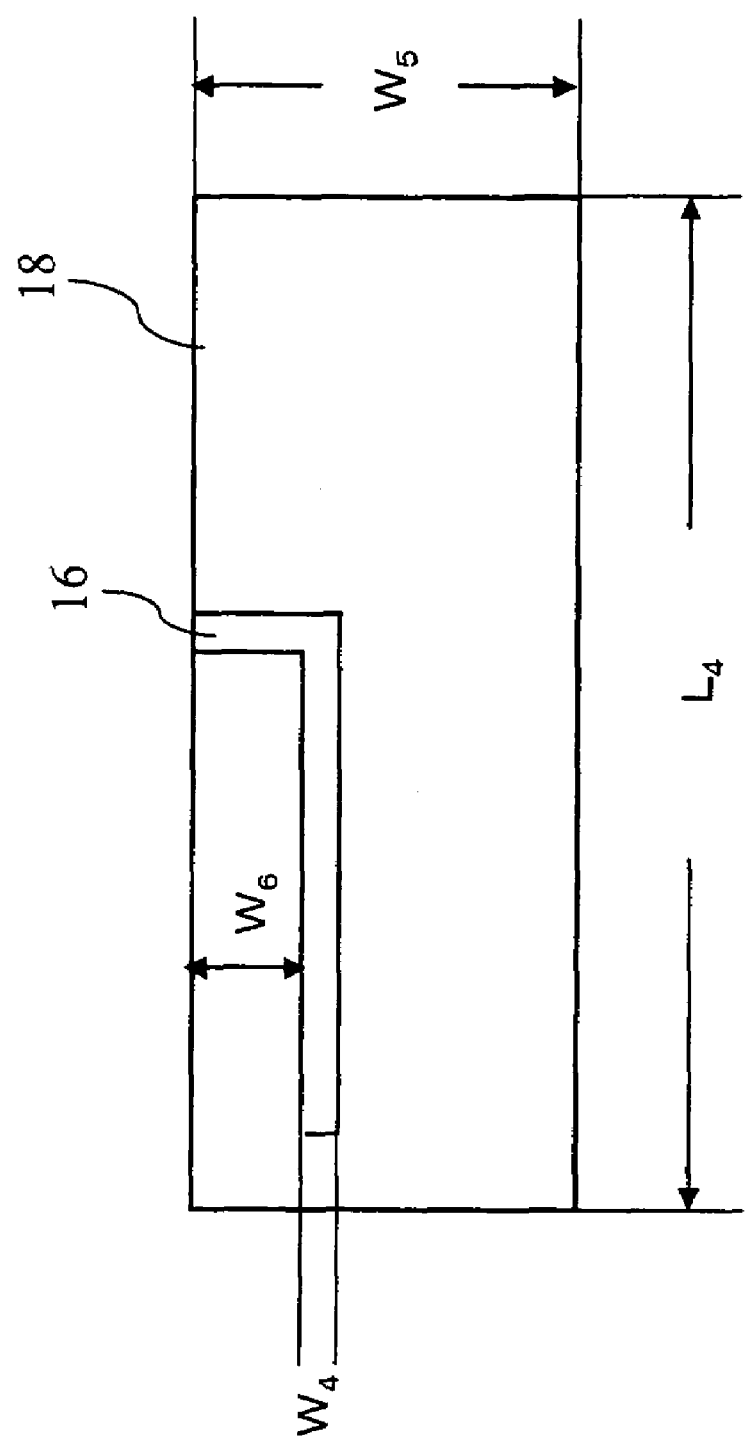
FIG. 5 shows one of portions of a matching circuit substrate in FIG. 4.
Figure 6:
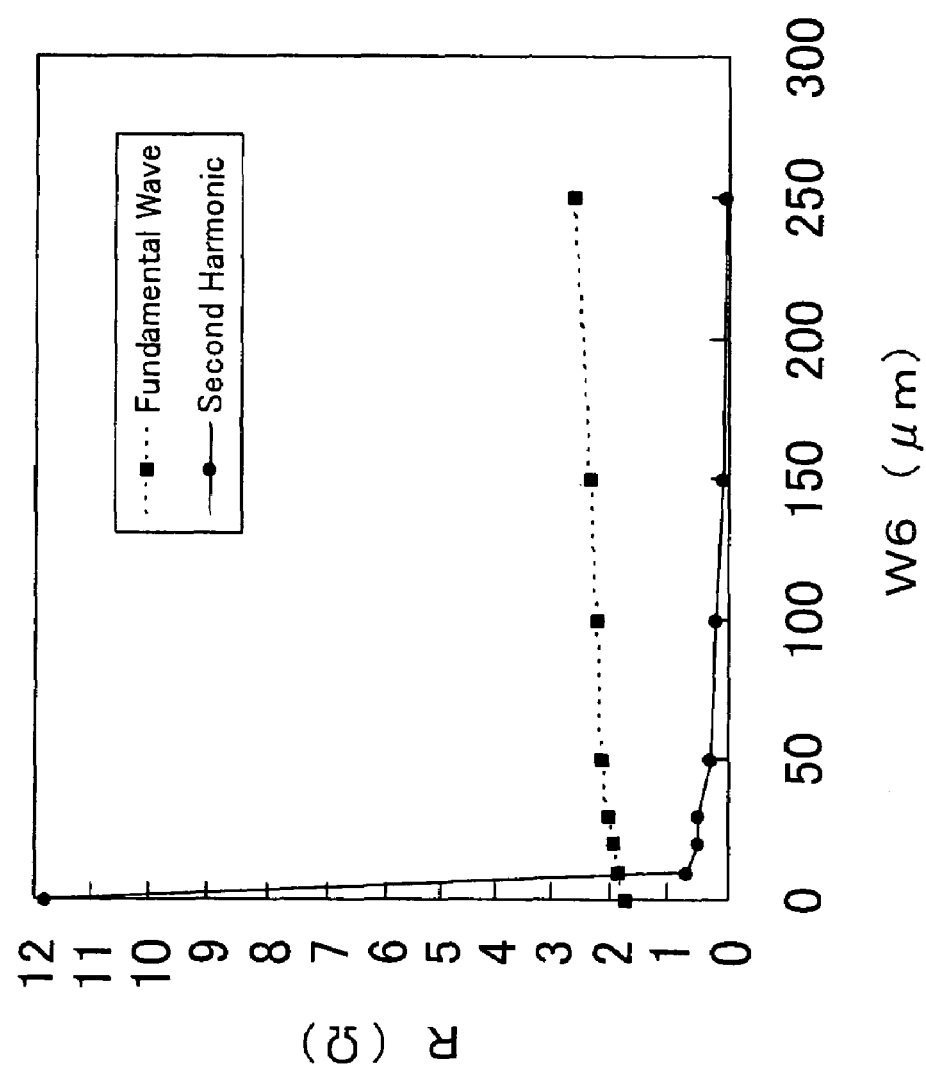
FIG. 6 shows a relationship between width $W_6$ and impedance in FIG. 4.

FIG. 5 shows one of the portions of the matching circuit substrate 13 separated by the substrate dividing slits 17 shown in FIG. 4. (This portion is hereinafter referred to as the "matching circuit substrate portion 18".) The matching circuit substrate portion 18 occupies approximately one quarter of the area of the entire matching circuit substrate 13. In the example shown in FIG. 5, the width $W_5$ and the length $L_4$ of the matching circuit substrate portion 18 are 0.95 mm and 1.9 mm, respectively, and the width $W_4$ of the region 16 is 0.05 mm. FIG. 6 shows a relationship between the width $W_6$ of the strip conductor portion, enclosed on three sides by the region 16 and an edge of the matching circuit substrate portion 18, and the impedance obtained from s-parameter data obtained through electromagnetic field simulation.

As shown in FIG. 6, the impedance of the matching circuit substrate portion 18 at the fundamental (5 GHz) changes from 1.9 O to 2.6 O when the width $W_6$ changes from 0 μm to 250 μm. That is, the impedance at the fundamental varies very little with the width $W_6$. At the second harmonic, however, the real part of the impedance drastically decreases with increasing width $W_6$. It should be noted that for the matching circuit 18 to fully acts as a short circuit at the second harmonic, its impedance must be 4 times or more smaller at the second harmonic than at the fundamental. FIG. 6 indicates that the width $W_6$ should be 25 μm or more. This value is approximately one thirty-eighth (⅟₃₈) of the width $W_5$ of the matching circuit substrate portion 18, meaning that the width $W_6$ must be set to one thirty-eighth (⅟₃₈) or more of the width $W_5$ for the matching circuit to fully act as a short circuit. Therefore, the width $W_6$ shown in FIG. 5 may be set to, for example, approximately 50 μm.

As described above, the present embodiment is characterized in that: regions with no strip conductor thereon are formed on the matching circuit substrate such that each region has an L-shape as viewed in plan; and one end of each region extends to meet a substrate dividing slit or an edge of the matching circuit substrate. This arrangement allows one to divide the substrate while adjusting the impedance of the matching circuit at the second harmonic. Therefore, it is possible to achieve impedance matching at both the fundamental and the second harmonic using a small substrate area.

Further, according to the present embodiment, there is no need for adding a new external circuit to the matching circuit substrate. Therefore, it is not necessary to change the size of the matching circuit substrate and hence the size of the package, preventing an increase in cost.

Further, the present embodiment allows the matching circuit to exhibit very low impedance at the second harmonic and hence act substantially as a short circuit to this harmonic. This arrangement enables the semiconductor device to achieve a near Class-F operation and hence high efficiency.

Further, the present embodiment allows the second harmonic to be short circuited and thereby internally reflected, reducing its leakage from the device. Therefore, it is possible to eliminate the external filter for reducing the second harmonic conventionally provided for the semiconductor device. Or alternatively, the conventional external filter may be replaced by a lower performance external filter. These allow one to reduce the size and cost of the entire semiconductor device package.

It should be noted that in the example shown in FIG. 4, an L-shaped region with no strip conductor thereon is provided in each of the four portions of the matching circuit substrate 13 separated by the substrate dividing slits 17. However, the present invention is not limited to this particular arrangement. Only one of the portions separated by the substrate dividing slits 17 may include an L-shaped region. However, the arrangement shown in FIG. 4 allows the matching circuit to more fully act as a short circuit and further increases the efficiency of the semiconductor device, since each enclosed strip line portion can act substantially as a short circuit. Furthermore, this arrangement can more noticeably reduce the leakage of the second harmonic from the semiconductor device.

Third Embodiment

Figure 7:
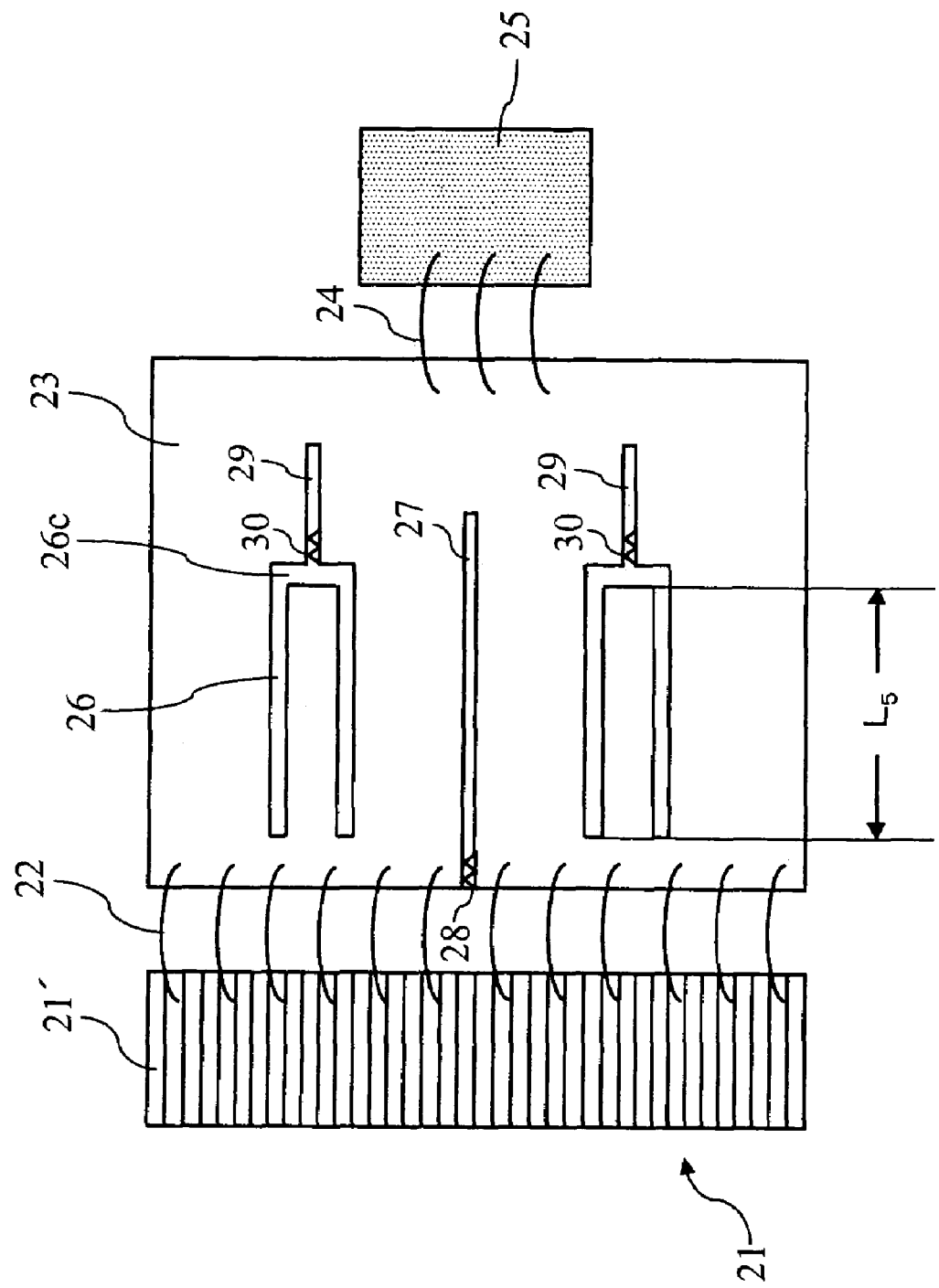
FIG. 7 is a plan view of a semiconductor device according to a third embodiment.

FIG. 7 is a plan view of a semiconductor device according to a third embodiment of the present invention. It should be noted that the following description uses the terms "first substrate dividing slit" and "second substrate dividing slit", which correspond to a wiring dividing region and another wiring dividing region, respectively, described in the appended claims.

Referring to the figure, an FET 21 includes a number of FET elements 21' disposed in parallel to one another. The drain electrodes (not shown) of the FET 21 are connected to a matching circuit substrate 23 by wires 22. Further, the source electrodes (not shown) of the FET 21 are connected to the ground electrode (not shown) on the back surface through via holes (not shown) provided in the FET 21. Though not shown in FIG. 7, the gate electrodes (not shown) of the FET 21, like the drain electrodes, are connected to another matching circuit substrate (not shown). The matching circuit substrate 23, to which the drain electrodes are connected, is connected to an external matching circuit 25 by wires 24. It should be noted that in FIG. 7 reference numeral 27 denotes a first substrate dividing slit. A resistance 28 may be provided on the drain electrode side of the first substrate dividing slit 27 as necessary to suppress odd modes.

The present embodiment is similar to the first embodiment in that regions 26 with no strip conductor thereon are formed on the matching circuit substrate 23 such that each region has a U-shape as viewed in plan, the U-shape being made up of two parallel long bar portions and one perpendicular short bar portion, denoted by reference numeral 26c in FIG. 7, connecting between the two long bar portions, as shown in FIGS. 1 and 7. However, according to the present embodiment, second substrate dividing slits 29 are additionally provided on the substrate such that each slit 29 is connected to the short-bar portion 26c of a respective region 26. This allows one to divide the substrate while adjusting the impedance of the matching circuit at the second harmonic. Therefore, it is possible to achieve impedance matching at both the fundamental and the second harmonic using a small substrate area. It should be noted that resistances 30 may be provided in the substrate dividing slits 29 as necessary to suppress odd modes.

According to the present embodiment, the length $L_5$ of each strip conductor enclosed on three sides by a respective region 26 is set substantially equal to one-eighth of the wavelength of the fundamental to cause the resonant line or strip line to resonate at a frequency double the operational frequency f (or the wavelength λ) of the semiconductor device. That is, the length $L_5$ of each strip conductor may be set substantially equal to 1/(4n) times the fundamental wavelength to short circuit the nth harmonic, wherein n is an integer.

As described above, the present embodiment is characterized in that regions with no strip conductor thereon are formed on the matching circuit substrate such that each region has a U-shape as viewed in plan, the U-shape being made up of two parallel long bar portions and one perpendicular short bar portion connecting between the two long bar portions; and second substrate dividing slits are formed on the substrate such that each second substrate dividing slit is connected to a respective short bar portion. This allows the area of the matching circuit substrate to be reduced, as compared to conventional arrangements, resulting in reduced cost.

Fourth Embodiment

Figure 8:
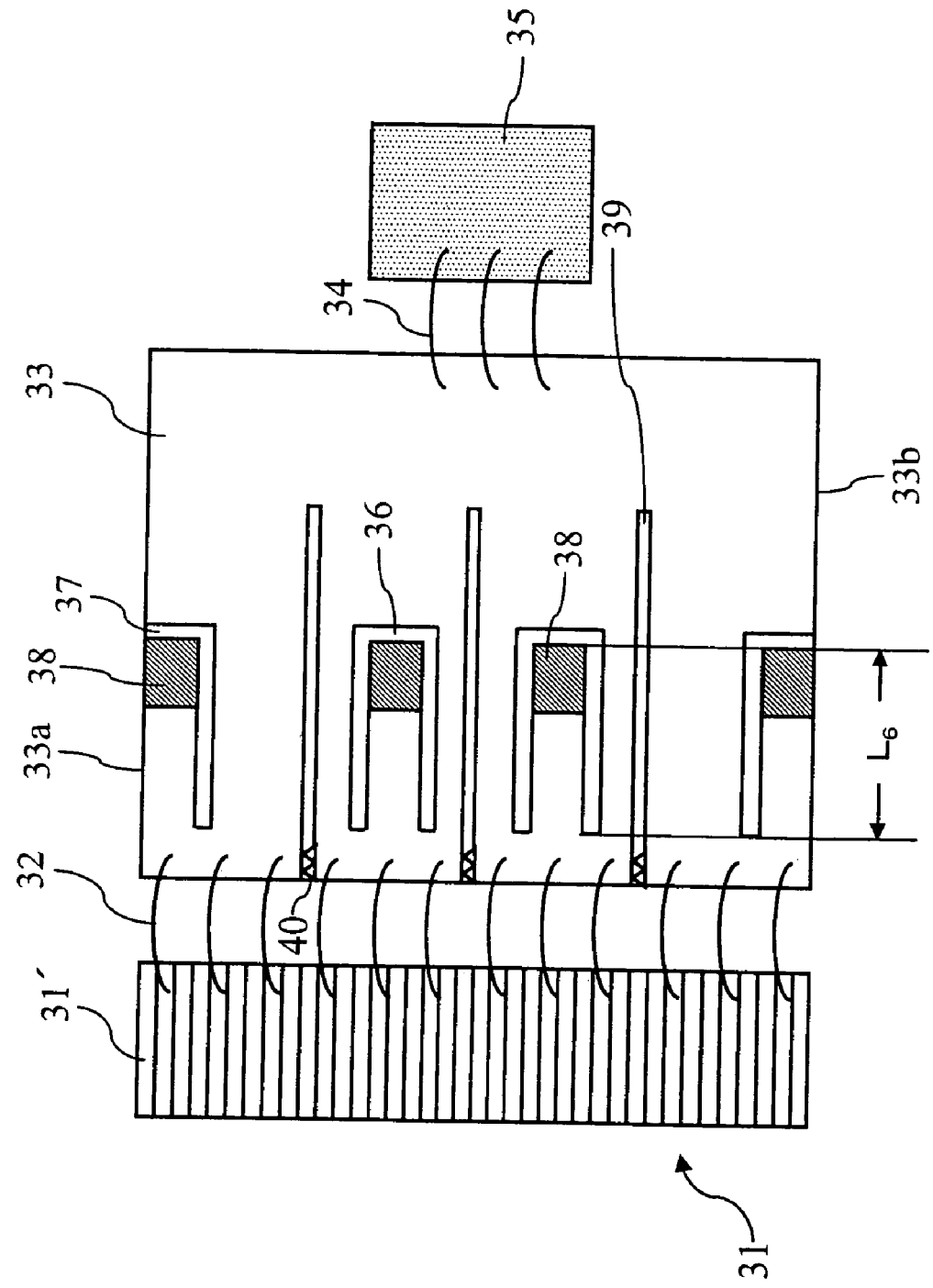
FIG. 8 is a plan view of a semiconductor device according to a fourth embodiment.

FIG. 8 is a plan view of a semiconductor device according to a fourth embodiment of the present invention.

Referring to the figure, an FET 31 includes a number of FET elements 31' disposed in parallel to one another. The drain electrodes (not shown) of the FET 31 are connected to a matching circuit substrate 33 by wires 32. Further, the source electrodes (not shown) of the FET 31 are connected to the ground electrode (not shown) on the back surface through via holes (not shown) provided in the FET 31. Though not shown in FIG. 8, the gate electrodes (not shown) of the FET 31, like the drain electrodes, are connected to another matching circuit substrate (not shown). The matching circuit substrate 33, to which the drain electrodes are connected, is connected to an external matching circuit substrate 35 by wires 34.

The present embodiment is characterized in that: regions with no strip conductor thereon are formed on the matching circuit substrate 33 such that each region has a U-shape or L-shape as viewed in plan; and an MIM capacitor (capacitance) 38 is provided in each portion enclosed on three sides by a respective U-shaped region 36 or by a respective L-shaped region 37 and the edge 33a or 33b of the matching circuit substrate together.

One end of each MIM capacitor 38 is connected to the open end portion of a respective strip conductor (not shown) formed on the surface of the matching circuit substrate 33, while the other end of each MIM capacitor 38 is connected to the ground electrode on the back surface through a via hole (not shown) provided in the matching circuit substrate 33. As a result, in this configuration, the strip conductors enclosed by the regions 36 and 37 are grounded through capacitances (i.e., MIM capacitors 38). Therefore, the MIM capacitors 38 can function as the so-called "short stubs".

It should be noted that in FIG. 8 reference numeral 39 denotes substrate dividing slits or wiring dividing regions, and resistances 40 may be provided on the drain electrode sides of the substrate dividing slits 39 as necessary to suppress odd modes.

If the length $L_6$ of each portion enclosed on three sides by a respective U-shaped region 36 or by a respective L-shaped region 37 and the edge 33a or 33b of the matching circuit substrate together is set to λ/4, the portion or the strip line appears as a "λ/4+λ/4" line at the second harmonic, which allows the matching circuit to act as a short circuit to this harmonic. Furthermore, the second harmonic may also be short circuited by bringing each pair of an MIM capacitor 38, having a capacitance of C, and a strip line, having the length $L_6$, into resonance at the second harmonic. Especially, the LC resonance technique allows one to achieve resonance at the second harmonic even when the wavelength is long by increasing the capacitance. As a result, it is possible to provide a small matching circuit substrate that can resonate at the second harmonic.

According to the present embodiment, MIM capacitors are provided within the matching circuit substrate to short circuit the second harmonic even when the wavelength λ is long. This arrangement allows even a small matching circuit substrate to act as a short circuit at the second harmonic, resulting in a reduction in the cost of the semiconductor device.

Further, the present embodiment allows the matching circuit to exhibit very low impedance at the second harmonic and hence act substantially as a short circuit to this harmonic. This arrangement enables the semiconductor device to achieve a near Class-F operation and hence high efficiency.

Further, the present embodiment allows the second harmonic to be short circuited and thereby internally reflected, reducing its leakage from the device. Therefore, it is possible to eliminate the external filter for reducing the second harmonic conventionally provided for the semiconductor device. Or alternatively, the conventional external filter may be replaced by a lower performance external filter. These allow one to reduce the size and cost of the entire semiconductor device package.

Fifth Embodiment

Figure 9:
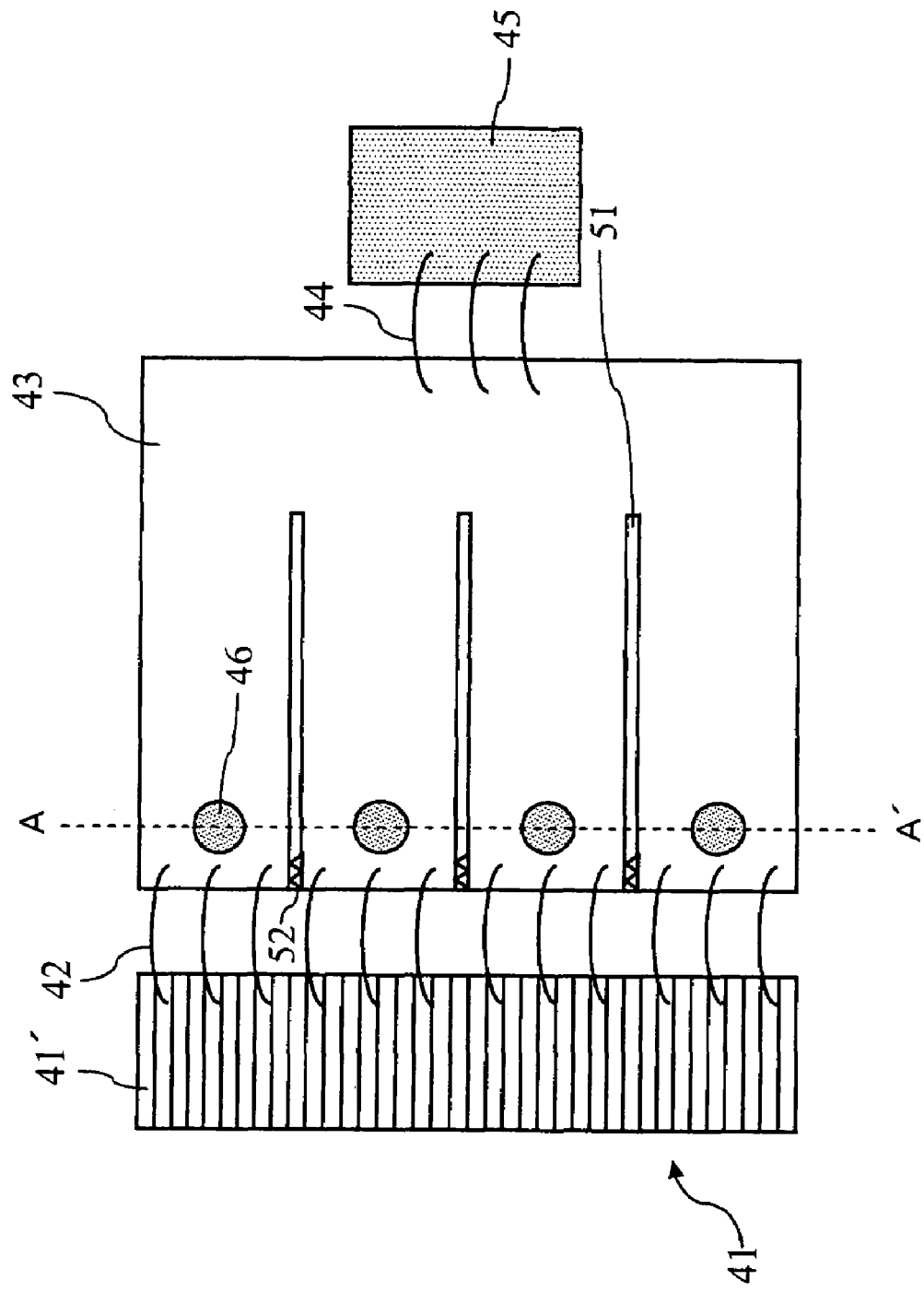
FIG. 9 is a plan view of a semiconductor device according to a fifth embodiment.
Figure 11:
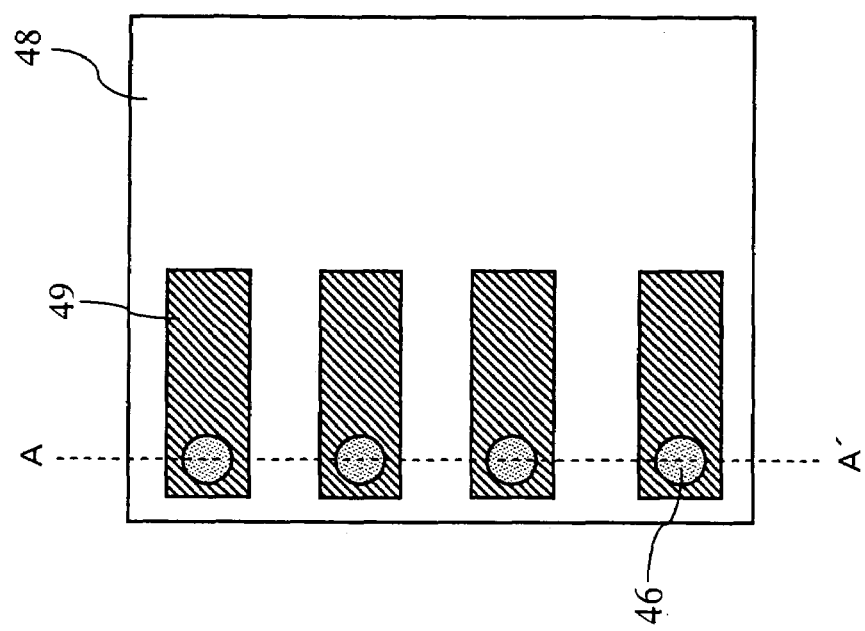
FIG. 11 is a plan view of an intermediate layer of a matching circuit substrate in FIG. 9.
Figure 10:
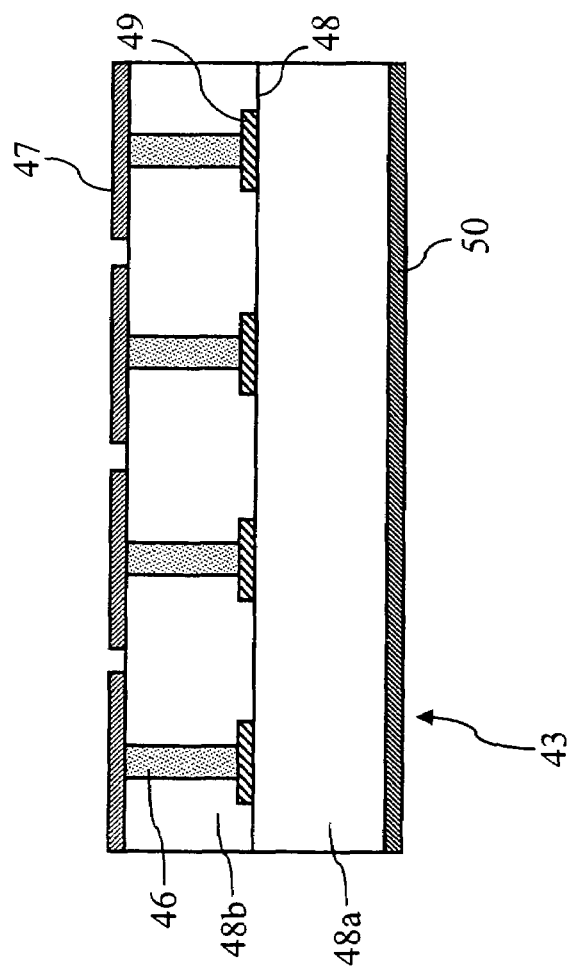
FIG. 10 is a cross-sectional view of a matching circuit substrate taken along line A-A' in FIG. 9.

FIG. 9 is a plan view of a semiconductor device according to a fifth embodiment of the present invention. FIG. 10 is a cross-sectional view of a matching circuit substrate 43 shown in FIG. 9 taken along line A-A'. Further, FIG. 11 is a plan view of the intermediate-layer 48 of the matching circuit substrate 43 shown in FIG. 9.

Referring to FIG. 9, an FET 41 includes a number of FET elements 41' disposed in parallel to one another. The drain electrodes (not shown) of the FET 41 are connected to the matching circuit substrate 43 by wires 42. Further, the source electrodes (not shown) of the FET 41 are connected to the ground electrode (not shown) on the back surface through via holes (not shown) provided in the FET 41. Though not shown in FIG. 9, the gate electrodes (not shown) of the FET 41, like the drain electrodes, are connected to another matching circuit substrate (not shown). The matching circuit substrate 43, to which the drain electrodes are connected, is connected to an external matching circuit substrate 45 by wires 44. It should be noted that in FIG. 9 reference numeral 51 denotes substrate dividing slits or wiring dividing regions, and resistances 52 may be provided on the drain electrode sides of the substrate dividing slits 51 as necessary to suppress odd modes.

As shown in FIG. 10, the matching circuit substrate 43 includes: a first dielectric layer 48a having a ground electrode 50 on its back surface; and a second dielectric layer 48b formed on the first dielectric layer 48a and having strip conductors 47 or fist strip conductors on its top surface. It should be noted that according to the present embodiment, the back surface of the matching circuit substrate 43 coincides with the back surface of the first dielectric layer 48a, and the top surface of the matching circuit substrate 43 coincides with the top surface of the second dielectric layer 48b.

As shown in FIG. 9, via holes 46 are provided in the side of the second dielectric layer 48b closest to the FET 41. One end of each via hole 46 is connected to a respective strip conductor 47, as shown in FIGS. 10 and 11. Further, the other end of each via hole 46 is connected to a respective one of harmonic resonant portions 49 or second strip conductors formed on the top surface of the first dielectric layer 48a. It should be noted that the wire length from the strip conductors 47 to the open end of the respective strip conductors 49 is set such that at a harmonic the matching circuit exhibits very small impedance and hence acts as a short circuit.

With the via holes 46, the harmonic resonant portions 49 resonate at a wavelength slightly shorter than one-eighth of the wavelength of the fundamental, that is, one-fourth of the wavelength of the second harmonic. The intermediate layer 48 is formed closer to the ground electrode 50 on the back surface than to the strip conductors 47 on the surface of the matching circuit substrate. Therefore, these lines, the matching circuit, have lower impedance than conventional lines, conventional matching circuit, if their widths are the same. As a result, the matching circuit exhibits lower impedance at the second harmonic.

For example, in FIGS. 2 and 3 described in connection with the first embodiment, when $W_2=200$ μm, the impedance R at the second harmonic is 0.44 O. On the other hand, in the above configuration of the present embodiment, when strip conductors having a width of 200 μm are formed on the intermediate layer as the harmonic resonant portions 49, the impedance at the second harmonic is as low as 0.04 O.

According to the present embodiment described above, harmonic resonant portions are provided on the intermediate layer in the matching circuit substrate, which allows the matching circuit to exhibit lower impedance than conventional matching circuits at the second harmonic and more fully act as a short circuit to this harmonic. This enables the semiconductor device to achieve a near Class-F operation and hence high efficiency.

Further, the present embodiment allows the second harmonic to be short circuited and thereby internally reflected, reducing its leakage from the device. Therefore, it is possible to eliminate the external filter for reducing the second harmonic conventionally provided for the semiconductor device. Or alternatively, the conventional external filter may be replaced by a lower performance external filter. These allow one to reduce the size and cost of the entire semiconductor device package.

Sixth Embodiment

Figure 12:
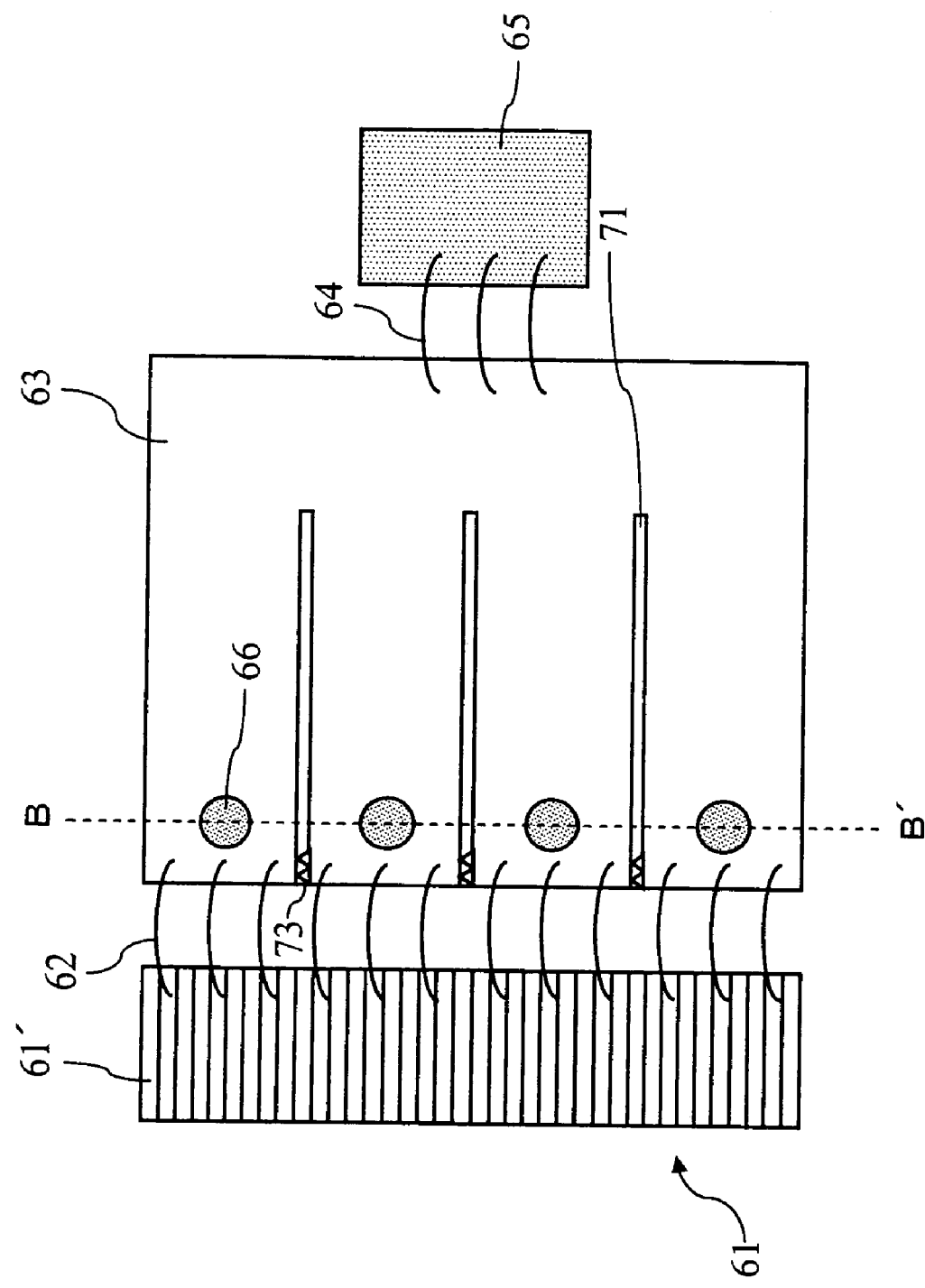
FIG. 12 is a plan view of a semiconductor device according to a sixth embodiment.
Figure 14:
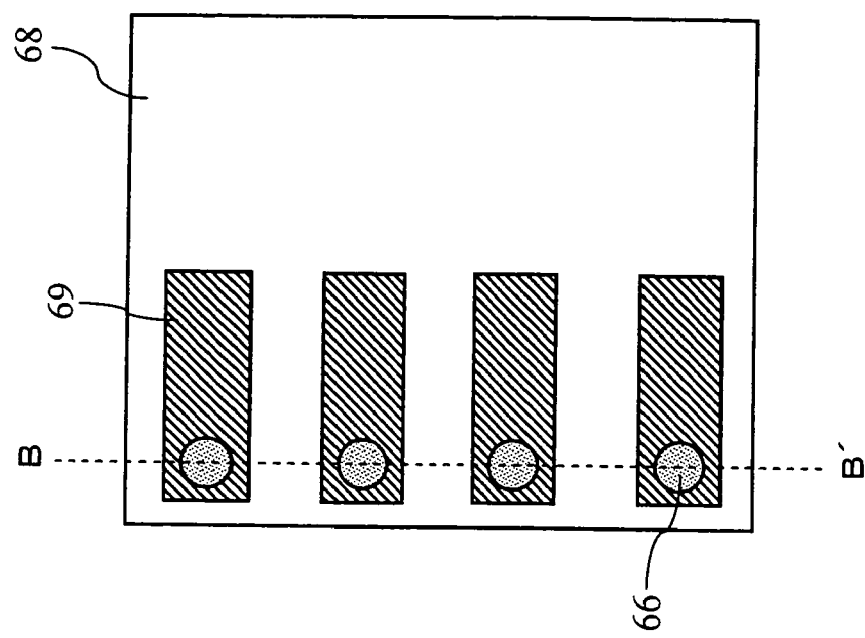
FIG. 14 is a plan view of an intermediate layer of a matching circuit substrate in FIG. 13.
Figure 13:
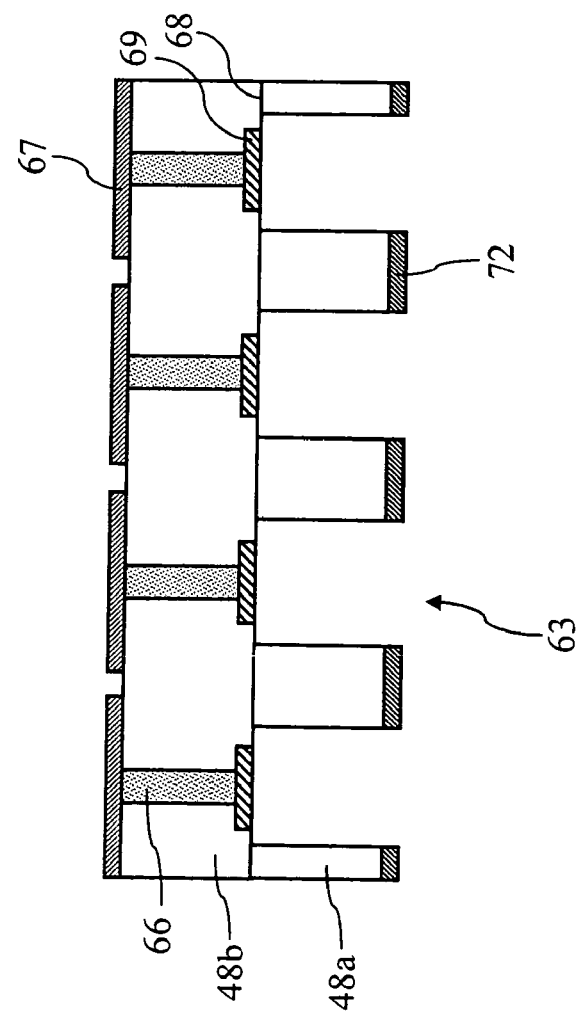
FIG. 13 is a cross-sectional view of a matching circuit substrate taken along line B-B' in FIG. 12.

FIG. 12 is a plan view of a semiconductor device according to a sixth embodiment of the present invention. FIG. 13 is a cross-sectional view of a matching circuit substrate 63 shown in FIG. 12 taken along line B-B'. Further, FIG. 14 is a plan view of the intermediate layer 68 of the matching circuit substrate 63 shown in FIG. 13.

Referring to FIG. 12, an FET 61 includes a number of FET elements 61' disposed in parallel to one another. The drain electrodes (not shown) of the FET 61 are connected to the matching circuit substrate 63 by wires 62. Further, the source electrodes (not shown) of the FET 61 are connected to the ground electrode (not shown) on the back surface through via holes (not shown) provided in the FET 61. Though not shown in FIG. 12, the gate electrodes (not shown) of the FET 61, like the drain electrodes, are connected to another matching circuit substrate (not shown). The matching circuit substrate 63, to which the drain electrodes are connected, is connected to an external matching circuit substrate 65 by wires 64. It should be noted that in FIG. 12 reference numeral 71 denotes substrate dividing slits or wiring dividing regions, and resistances 73 may be provided on the drain electrode sides of the substrate dividing slits 71 as necessary to suppress odd modes.

As shown in FIG. 13, the matching circuit substrate 63 includes: a first dielectric layer 68a having a ground electrode 72 on its back surface; and a second dielectric layer 68b formed on the first dielectric layer 68a and having strip conductors 67 or first strip conductors on its top surface. It should be noted that according to the present embodiment, the back surface of the matching circuit substrate 63 coincides with the back surface of the first dielectric layer 68a, and the top surface of the matching circuit substrate 63 coincides with the top surface of the second dielectric layer 68b.

As shown in FIG. 12, via holes 66 are provided in the side of the second dielectric layer 68b closest to the FET 61. One end of each via hole 66 is connected to a respective strip conductor 67, as shown in FIGS. 13 and 14. Further, the other end of each via hole 66 is connected to a respective one of harmonic resonant portions 69 or second strip conductors formed on the top surface of the first dielectric layer 68a. It should be noted that the wire length from the strip conductors 67 to the ground electrode 72 is set such that at a harmonic the matching circuit exhibits very small impedance and hence acts as a short circuit.

The present embodiment is characterized in that the portions of the first dielectric layer 68a under the harmonic resonant portions 69 have been removed. Since this structure allows one to increase the Q value of the harmonic resonant portions 69, the matching circuit can exhibit lower impedance than the matching circuit of the fifth embodiment at the second harmonic. This enables the semiconductor device to achieve a near Class-F operation and further increase efficiency.

Further, the present embodiment allows the second harmonic to be short circuited and thereby internally reflected, reducing its leakage from the device. Therefore, it is possible to eliminate the external filter for reducing the second harmonic conventionally provided for the semiconductor device. Or alternatively, the conventional external filter may be replaced by a lower performance external filter. These allow one to reduce the size and cost of the entire semiconductor device package.

Seventh Embodiment

Figure 15:
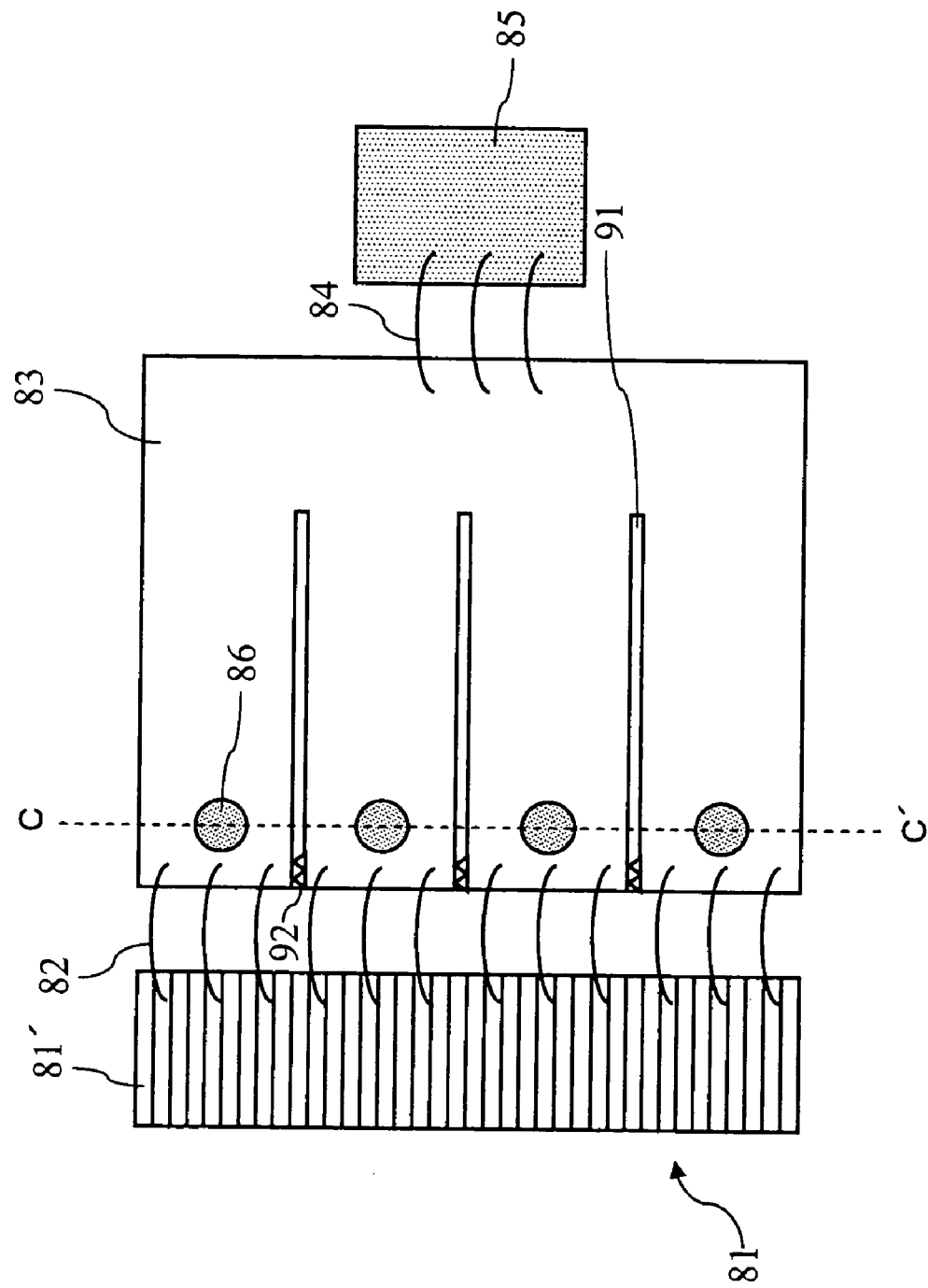
FIG. 15 is a plan view of a semiconductor device according to a seventh embodiment.
Figure 17:
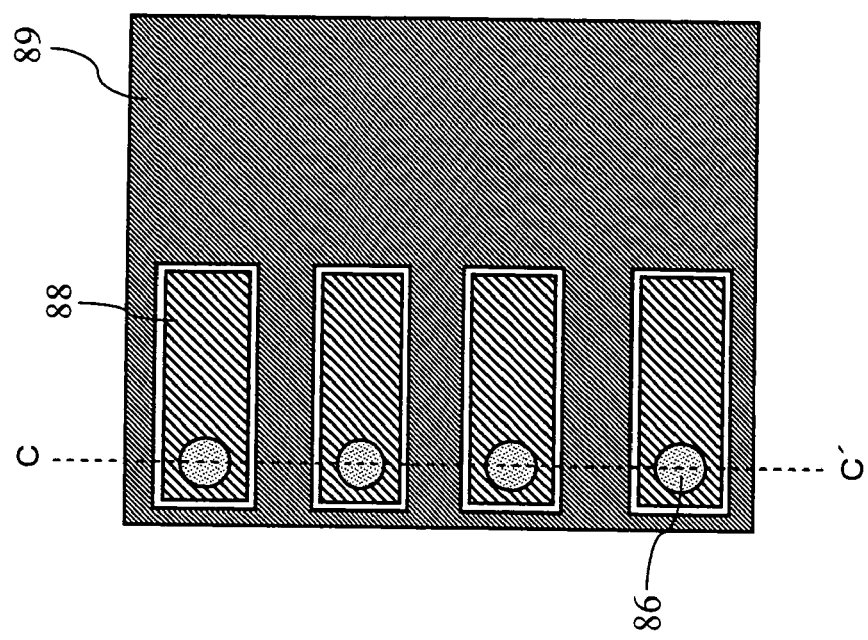
FIG. 17 is a plan view of the back surface of the matching circuit substrate in FIG. 15.
Figure 16:
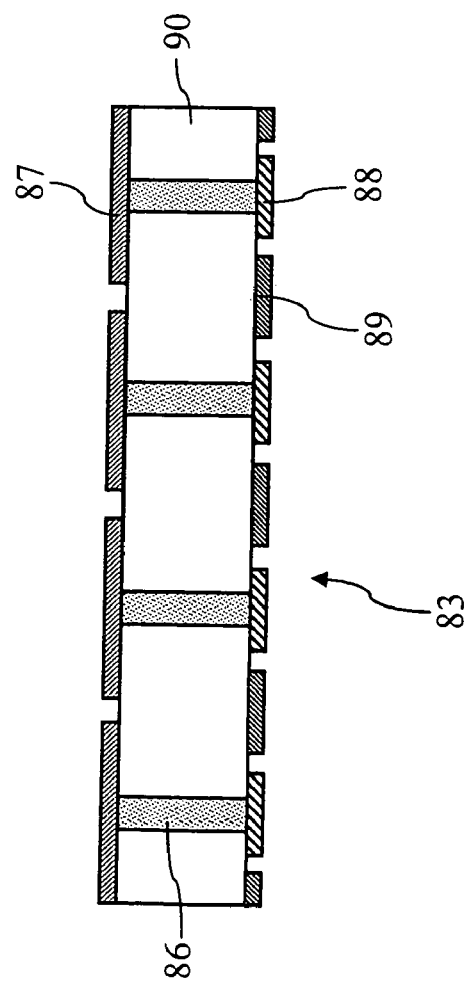
FIG. 16 is a cross-sectional view of a matching circuit substrate taken along line C-C' in FIG. 15.

FIG. 15 is a plan view of a semiconductor device according to a seventh embodiment of the present invention. FIG. 16 is a cross-sectional view of a matching circuit substrate 83 shown in FIG. 15 taken along line C-C'. Further, FIG. 17 is a plan view of the back surface of the matching circuit substrate 83 shown in FIG. 15.

Referring to FIG. 15, an FET 81 includes a number of FET elements 81' disposed in parallel to one another. The drain electrodes (not shown) of the FET 81 are connected to the matching circuit substrate 83 by wires 82. Further, the source electrodes (not shown) of the FET 81 are connected to the ground electrode (not shown) on the back surface through via holes (not shown) provided in the FET 81. Though not shown in FIG. 15, the gate electrodes (not shown) of the FET 81, like the drain electrodes, are connected to another matching circuit substrate (not shown). The matching circuit substrate 83, to which the drain electrodes are connected, is connected to an external matching circuit substrate 85 by wires 84. It should be noted that in FIG. 15 reference numeral 91 denotes substrate dividing slits or wiring dividing regions, and resistances 92 may be provided on the drain electrode sides of the substrate dividing slits 91 as necessary to suppress odd modes.

Further, the matching circuit substrate 83 of the present embodiment includes a dielectric layer 90 having harmonic resonant portions 88 or second strip conductors and a ground electrode 89 on its back surface, as shown in FIG. 16. It should be noted that according to the present embodiment, the back surface of the matching circuit substrate 83 coincides with the back surface of the dielectric layer 90, and the top surface of the matching circuit substrate 83 coincides with the top surface of the dielectric layer 90.

As shown in FIG. 15, via holes 86 are provided in the side of the dielectric layer 90 closest to the FET 81. One end of each via hole 86 is connected to a respective one of strip conductors 87 or first strip conductors formed on the top surface of the dielectric layer 90, as shown in FIG. 16. Furthermore, the other end of each via hole 86 is connected to a respective harmonic resonant portion 88 formed on the back surface of the dielectric layer 90, as shown in FIGS. 16 and 17. Further, the ground electrode 89 is formed around the harmonic resonant portions 88, as shown in FIG. 17.

Thus, the present embodiment is characterized in that the harmonic resonant portions are provided on the back surface of the matching circuit substrate. That is, it is not necessary to form an intermediate layer within the matching circuit substrate. This allows one to reduce the number of processes required to manufacture the matching circuit substrate, resulting in low-cost production of the substrate.

It should be noted that when this semiconductor device is mounted in a package, each harmonic resonant portion may be coated with a dielectric, or protruding portions may be formed around the harmonic resonant portions 88, to prevent the harmonic resonant portions 88 from electrical contact.

Eighth Embodiment

Figure 18:
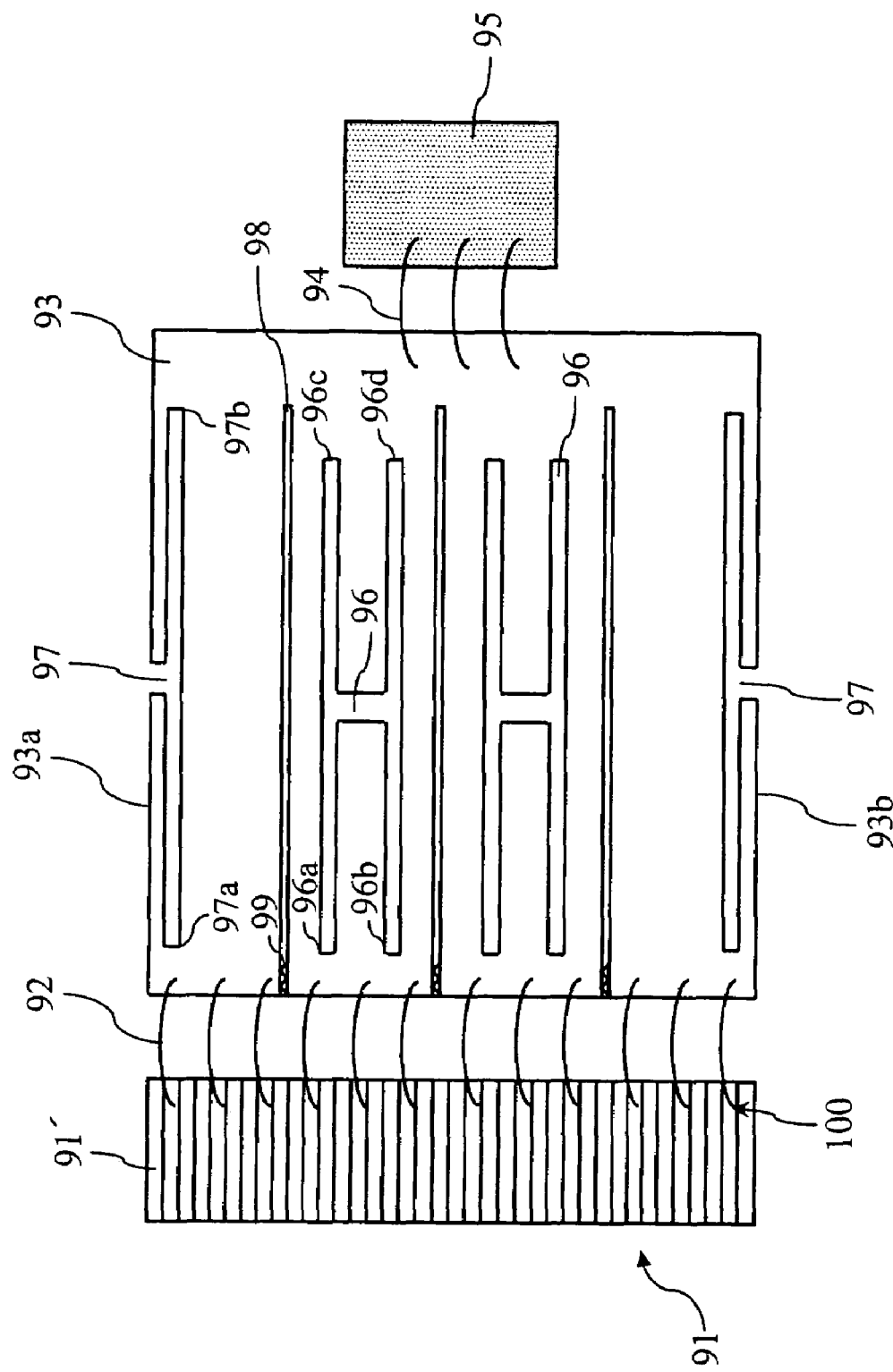
FIG. 18 is a plan view of a semiconductor device according to a eighth embodiment.

FIG. 18 is a plan view of a semiconductor device according to an eighth embodiment of the present invention.

Referring to the figure, an FET 91 includes a number of FET elements 91' disposed in parallel to one another. The drain electrodes (not shown) of the FET 91 are connected to a matching circuit substrate 93 by wires 92. Further, the source electrodes (riot shown) of the FET 91 are connected to the ground electrode (not shown) on the back surface through via holes (not shown) provided in the FET 91. Though not shown in FIG. 18, the gate electrodes (not shown) of the FET 91, like the drain electrodes, are connected to another matching circuit substrate (not shown). The matching circuit substrate 93, to which the drain electrodes are connected, is connected to an external matching circuit substrate 95 by wires 94.

The present embodiment is characterized in that: regions 96 with no strip conductor thereon are formed on the matching circuit substrate 93 such that each region 96 has an H shape as viewed in plan; and two slits 97 are cut into the matching circuit substrate 93 such that they extend along edges 93a and 93b, respectively, of the substrate and have a T-shape as viewed in plan. The length of each strip conductor enclosed on three sides by a respective region 96 or by a respective slit 97 and the edge 93a or 93b of the matching circuit substrate 93 together is set substantially equal to one-eighth of the wavelength λ of the fundamental to cause the strip line to resonate at a frequency double the operational frequency f (or the wavelength λ) of the semiconductor device. It should be noted that in FIG. 18 reference numeral 98 denotes substrate dividing slits or wiring dividing regions, and resistances 99 may be provided on the drain electrode sides of the substrate dividing slits 98 as necessary to suppress odd modes.

As shown in FIG. 18, end portions 96a and 96b of each region 96 are located on the FET 91 drain electrode side of the matching circuit substrate 93, while end portions 96c and 96d of each region 96 are located on the opposite side of the matching circuit substrate 93. Further, one end 97a of each slit 97 is located on the drain electrode side of the matching circuit substrate 93, while the other end 97b is located on the opposite side of the matching circuit substrate 93.

The strip conductors on the drain side of the matching circuit substrate 93, which are each enclosed on three sides by a respective region 96 portion, including end portions 96a and 96b, or by a respective slit 97 portion, including an end portion 97a, and the edge 93a or 93b of the matching circuit substrate 93 together, have a length substantially equal to a quarter wavelength of the second harmonic, and hence their strip lines act as short circuits at the second harmonic. Further, the strip conductors on the opposite side of the matching circuit substrate 93, which are each enclosed on three sides by a respective region 96 portion, including end portions 96c and 96d, or by a respective slit 97 portion, including an end portion 97b, and the edge 93a or 93b of the matching circuit substrate 93 together, also have a length substantially equal to a quarter wavelength of the second harmonic, that is, the distance between the drain end 100 and the farthest end of each strip conductor on the opposite side is λ/4, and hence their strip lines act as short circuits at the second harmonic. As a result, at the second harmonic the overall matching circuit exhibits impedance approximately two times lower than that of the matching circuits of the first and second embodiments.

It should be noted that in the example shown in FIG. 18, two H-shaped regions 96 and two T-shaped slits 97 are provided in the matching circuit substrate 93. With this arrangement, the matching circuit can exhibit impedance two times lower than that of a matching circuit including only one H-shaped region 96 and only one T-shaped slit 97, enabling the semiconductor device to achieve a near Class-F operation and further increase efficiency.

Further, the present embodiment allows the second harmonic to be short circuited and thereby internally reflected, reducing its leakage from the device. Therefore, it is possible to eliminate the external filter for reducing the second harmonic conventionally provided for the semiconductor device. Or alternatively, the conventional external filter may be replaced by a lower performance external filter. These allow one to reduce the size and cost of the entire semiconductor device package.

Ninth Embodiment

Figure 19:
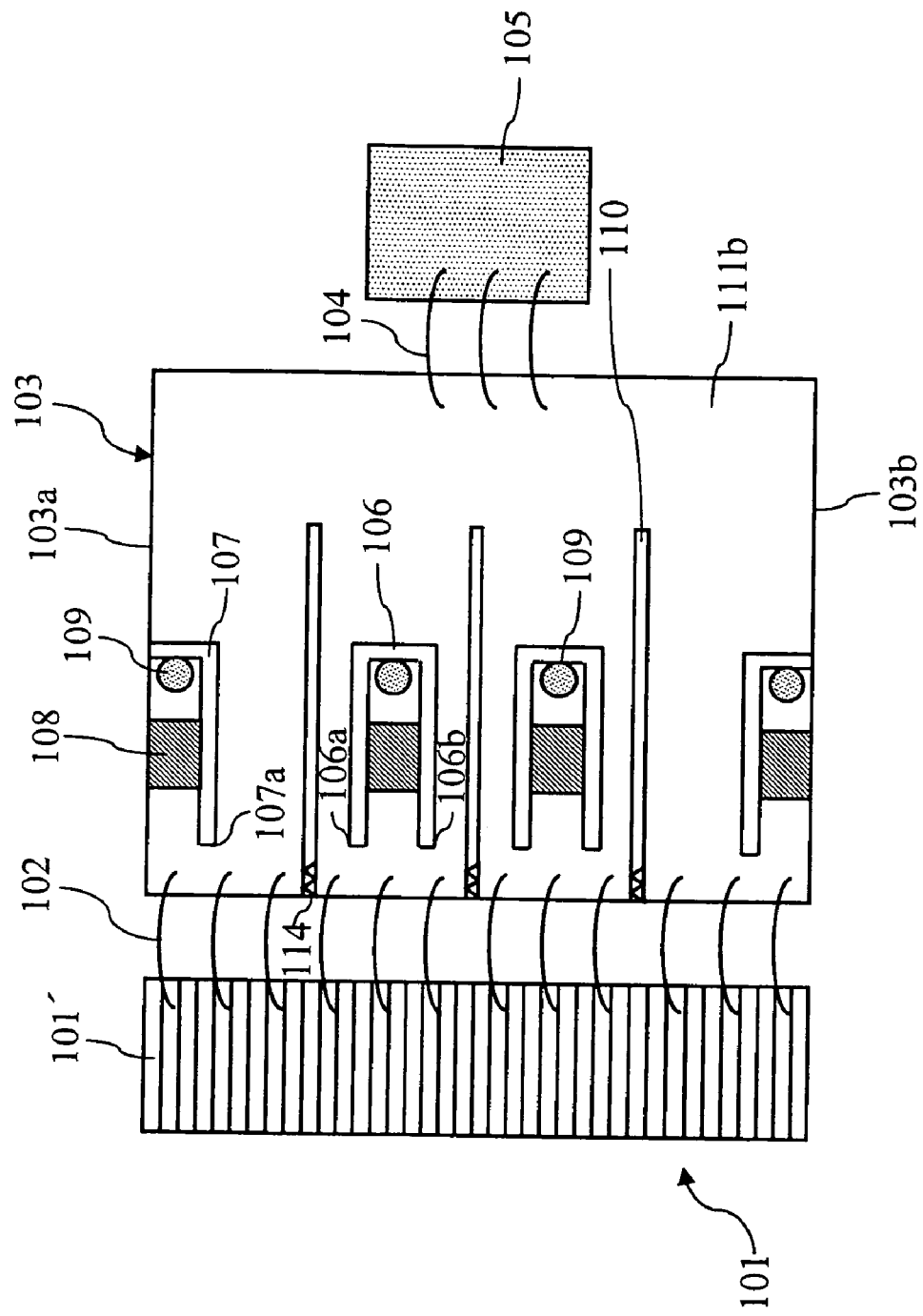
FIG. 19 is a plan view of a semiconductor device according to a ninth embodiment.
Figure 20:
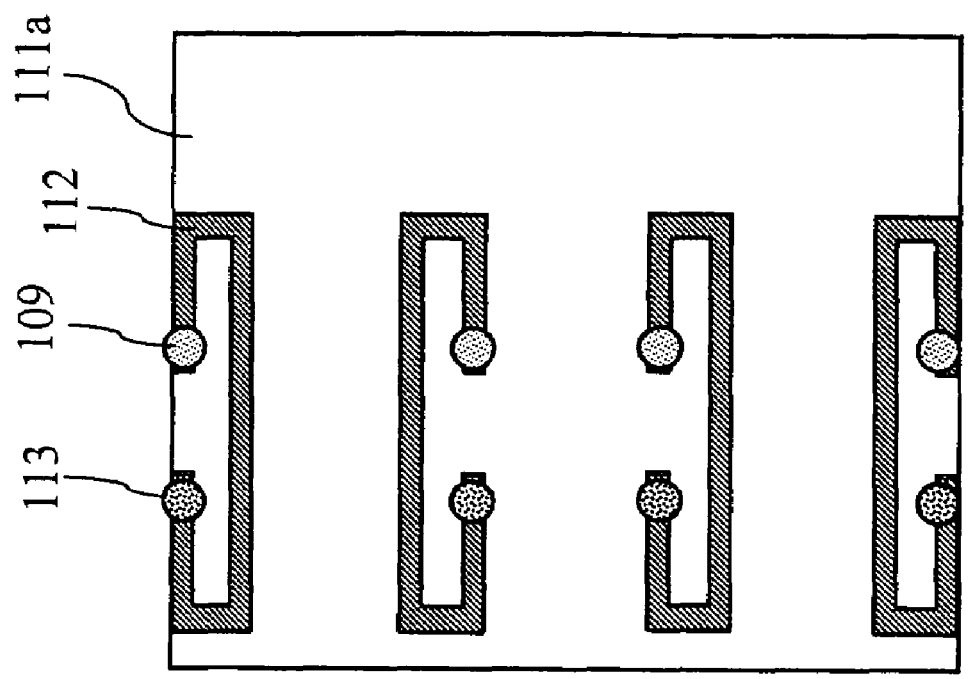
FIG. 20 is a plan view of an intermediate layer of a matching circuit substrate in FIG. 19.

FIG. 19 is a plan view of a semiconductor device according to a ninth embodiment of the present invention. FIG. 20 is a plan view of the intermediate layer of the matching circuit substrate shown in FIG. 19.

Referring to FIG. 19, an FET 101 includes a number of FET elements 101' disposed in parallel to one another. The drain electrodes (not shown) of the FET 101 are connected to a matching circuit substrate 103 by wires 102. Further, the source electrodes (not shown) of the FET 101 are connected to the ground electrode (not shown) on the back surface through via holes (not shown) provided in the FET 101. Though not shown in FIG. 19, the gate electrodes (not shown) of the FET 101, like the drain electrodes, are connected to another matching circuit substrate (not shown). The matching circuit substrate 103, to which the drain electrodes are connected, is connected to an external matching circuit substrate 105 by wires 104. It should be noted that in FIG. 19 reference numeral 110 denotes substrate dividing slits, or wiring dividing regions, and resistances 114 may be provided on the drain electrode sides of the substrate dividing slits 110 as necessary to suppress odd modes.

The present embodiment is characterized in that: regions 106 and 107 with no strip conductor thereon are formed on the matching circuit substrate 103 such that they have a U-shape and an L-shape, respectively, as viewed in plan; and an MIM capacitor 108 and a via hole 109 are provided in each portion enclosed on three sides by a respective U-shaped region 106 or by a respective L-shaped region 107 and the edge 103a or 103b of the matching circuit substrate 103 together. It should be noted that the present embodiment may be configured such that: L-shaped regions 107 and substrate dividing slits 110 may be formed such that they together enclose portions of the surface of the matching circuit substrate 103 on three sides; and an MIM capacitor 108 and a via hole 109 may be provided in each of these enclosed portions.

The matching circuit substrate 103 of the present embodiment includes: a first dielectric layer 111a having a ground electrode (not shown) on its back surface; and a second dielectric layer 111b formed on the first dielectric layer 111a and having strip conductors (not shown) on its top surface. It should be noted that according to the present embodiment, the back surface of the matching circuit substrate 103 coincides with the back surface of the first dielectric layer 111a, and the top surface of the matching circuit substrate 103 coincides with the top surface of the second dielectric layer 111b.

One end of each MIM capacitor 108 is connected in series to, or inserted into, a respective strip conductor formed on the surface of the second dielectric layer 111b, allowing RF (radio frequency) signals to pass but not allowing DC (direct current) signals to pass. Further, first via holes 109 are provided in the second dielectric layer 111b, and the other end of each MIM capacitor 108 is connected through a via hole 109 to a respective one of strip conductors 112 formed on the first dielectric layer 111a, as shown in FIG. 20. Further, the strip conductors 112 are connected to the ground electrode through second via holes 113 provided in the first dielectric layer 111a.

According to the present embodiment, the wire length from each strip conductor formed on the surface of the second dielectric layer 111b to the ground electrode is set substantially equal to a half wavelength of the fundamental. This allows the end portions 106a, 106b, and 107a to exhibit very high impedance at the fundamental and odd harmonics and hence act as an open circuit to these waves while exhibiting very low impedance at the even harmonics including the second harmonic and hence acting as a short circuit to the even harmonics. With this, the semiconductor device can achieve a near Class-F operation and hence high efficiency.

It should be noted that the present invention have been described as applied to the matching circuit substrate on the output side of semiconductor devices with reference to the first to ninth embodiments. However, the present invention is not limited to this particular arrangement and may be applied to the matching circuit substrate on the input side of the semiconductor devices. In such a case, however, the first embodiment must be modified such that both ends 6a and 6b of each region 6 are disposed on the FET 1 gate electrode side of the matching circuit substrate. The second to ninth embodiments also require similar modifications.

Further, as described above, the first to ninth embodiments are configured so as to short circuit the second harmonic to achieve Class-F matching. However, the present invention is not limited to this particular arrangement. For example, the third harmonic may be short circuited to achieve inverse Class-F matching. In such a case, however, the first embodiment must be modified such that the length $L_1$ of each strip conductor enclosed on three sides by a respective U-shaped region 6 is set to $\lambda/12$. That is, to short circuit the nth harmonic, the present invention sets each strip conductor constituting the matching circuit to a length of $\lambda/(4n)$, thereby reducing the leakage of the harmonic from the semiconductor device.

The features and advantages of the present invention may be summarized as follows.

As described above, the present invention eliminates the need for adding a new external circuit to the matching circuit substrate. Therefore, it is not necessary to change the size of the matching circuit substrate and hence the size of the package, preventing an increase in cost.

Further, the present invention allows the matching circuit to exhibit very low impedance at a particular harmonic and hence act as a short circuit to this harmonic. This arrangement enables the semiconductor device to achieve a near Class-F operation and hence high efficiency.

Still further, the present invention allows the second harmonic to be short circuited and thereby internally reflected, reducing its leakage from the device. This allows one to reduce the size and cost of the entire semiconductor device package.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-004387, filed on Jan. 11, 2005 including specification, claims, drawings and summary, on which the Convention priority of the present application is based, are incorporated herein by reference in its entirety.

What is claimed is:

1. A semiconductor device comprising:
   a transistor;
   a matching circuit substrate having a surface covered by a sheet electrical conductor that is electrically connected to said transistor; and
   a plurality of first wiring dividing regions on said matching circuit substrate and dividing said sheet electrical conductor into respective wiring areas, wherein
   at least one of said wiring areas includes a region where said sheet electrical conductor is not present, said region having a U-shape, as viewed in plan, enclosing a strip conductor on three sides, and surrounded by said sheet electrical conductor, and
   length of said strip conductor enclosed by said region is set such that, at a harmonic of a fundamental frequency a strip line, including said strip conductor enclosed by said region, exhibits very low impedance and acts as a short circuit.

2. The semiconductor device according to claim 1, wherein the length of said strip conductor enclosed by said region is substantially equal to $1/(4n)$ times the wavelength corresponding to the fundamental frequency, to short circuit the nth harmonic, where n is an integer.

3. The semiconductor device according to claim 1, wherein both ends of said U-shaped region are disposed proximate an edge of said surface of said matching circuit substrate that is closest to said transistor.

4. The semiconductor device according to claim 1, wherein said U-shape includes two parallel long bar portions and one perpendicular short bar portion connecting said two parallel long bar portions, and including a second wiring dividing region, where said sheet electrical conductor is not present, connected to said perpendicular short bar portion.

5. The semiconductor device according to claim 1, further comprising a capacitance, wherein a first end of said capacitance is connected to an open end portion of said strip conductor enclosed on three sides by said U-shaped region, and a second end of said capacitance is grounded.

6. The semiconductor device according to claim 1, wherein:
   at least one of said wiring areas includes two regions where said sheet electrical conductor is not present, each region having a U-shape, as viewed in plan, enclosing a respective strip conductor on three sides, and surrounded by said sheet electrical conductor;
   said two U-shaped regions are connected in series in the direction of a traveling wave; and
   both ends of a first of said two U-shaped regions are disposed proximate an edge of said surface of said matching circuit substrate that is closest to said transistor.

7. The semiconductor device according to claim 1, wherein:
   said matching circuit substrate includes a first dielectric layer and a second dielectric layer on said first dielectric layer, said first dielectric layer having a ground electrode on a back surface thereof, said second dielectric layer having said strip conductor on a surface thereof;
   a capacitance is located on said matching circuit substrate, a first end of said capacitance being connected to said strip conductor enclosed on three sides by said U-shaped region, a second end of said capacitance being electrically connected to a second strip conductor located on a surface of said first dielectric layer, through a first via hole located in said second dielectric layer;
   said second strip conductor is electrically connected to said ground electrode through a second via hole located in said first dielectric layer; and
   wire length from said second strip conductor to said ground electrode is substantially equal to one half the wavelength corresponding to the fundamental frequency.

* * * * *